United States Patent
Yano et al.

(10) Patent No.: US 8,018,767 B2
(45) Date of Patent: Sep. 13, 2011

(54) SEMICONDUCTOR DEVICE AND METHOD OF CONTROLLING THE SAME

(75) Inventors: Masaru Yano, Tokyo (JP); Kazuhide Kurosaki, Tokyo (JP); Mototada Sakashita, Tokyo (JP)

(73) Assignee: Spansion, LLC, Sunnyvale, CA (US)

( * ) Notice: Subject to any disclaimer, the term of this patent is extended or adjusted under 35 U.S.C. 154(b) by 61 days.

(21) Appl. No.: 12/275,121

(22) Filed: Nov. 20, 2008

(65) Prior Publication Data

US 2009/0109757 A1    Apr. 30, 2009

Related U.S. Application Data

(60) Division of application No. 11/637,260, filed on Dec. 11, 2006, now Pat. No. 7,468,909, which is a continuation of application No. PCT/JP2005/023021, filed on Dec. 15, 2005.

(51) Int. Cl.
*G11C 11/34* (2006.01)
*G11C 16/04* (2006.01)
*G11C 5/06* (2006.01)
*G11C 7/00* (2006.01)
*G11C 8/00* (2006.01)

(52) U.S. Cl. ............... 365/185.05; 365/63; 365/185.11; 365/185.16; 365/203; 365/230.03

(58) Field of Classification Search .............. 365/63, 365/185.05, 185.11, 185.16, 203, 230.03
See application file for complete search history.

(56) References Cited

U.S. PATENT DOCUMENTS

| | | | |
|---|---|---|---|
| 4,404,659 A | 9/1983 | Kihara et al. | |
| 5,021,999 A | 6/1991 | Kohda et al. | |
| 5,027,321 A | 6/1991 | Park | |
| 5,124,945 A | 6/1992 | Schreck | |
| 5,132,933 A | 7/1992 | Schreck et al. | |
| 5,359,555 A | 10/1994 | Salter, III | |
| 6,011,725 A | 1/2000 | Eitan | |
| 6,038,172 A | 3/2000 | Rai et al. | |
| 6,826,069 B2 * | 11/2004 | Kurjanowicz et al. | .......... 365/63 |
| 6,829,173 B2 | 12/2004 | Ooishi | |
| 7,221,587 B2 | 5/2007 | Yamashita et al. | |
| 2004/0006664 A1 | 1/2004 | Helzer et al. | |
| 2004/0027857 A1 * | 2/2004 | Ooishi | .............. 365/185.11 |
| 2006/0092702 A1 | 5/2006 | Lee | |

FOREIGN PATENT DOCUMENTS

| | | |
|---|---|---|
| JP | 11273388 | 10/1999 |
| JP | 2002279789 | 9/2002 |
| JP | 2003346488 | 12/2003 |

(Continued)

OTHER PUBLICATIONS

Non-Final Office Action Dated Apr. 2, 2008; U.S. Appl. No. 11/637,260.

(Continued)

*Primary Examiner* — Ly D Pham

(57) ABSTRACT

The present invention provides a semiconductor device that includes: a memory cell array that includes non-volatile memory cells; a first selecting circuit that connects or disconnects a source and a drain of a transistor that forms one of the memory cells, to or from a data line DATAB connected to a first power supply; and a second selecting circuit that connects or disconnects the source and drain to or from a ground line ARVSS connected to a second power supply. In this semiconductor device, the first selecting circuit and the second selecting circuit are arranged on the opposite sides of the memory cell array. The present invention also provides a method of controlling the semiconductor device.

17 Claims, 17 Drawing Sheets

FOREIGN PATENT DOCUMENTS

| WO | 2004006263 | 1/2004 |
|----|------------|--------|
| WO | 2005109441 | 5/2004 |

OTHER PUBLICATIONS

Notice of Allowance Dated Aug. 21, 2008; U.S. Appl. No. 11/637,260.

PCT "Written Opinion of the International Searching Authority"; Date of mailing: Mar. 28, 2006; International Application No. PCT/JP20051023021; 5 Pages.

PCT English Translation of "Written Opinion of the International Searching Authority"; Date of mailing: Mar. 28, 2006; International Application No. PCT/JP2005/023021; 6 Pages.

PCT "International Preliminary Report on Patentability"; Date of issuance Jun. 28, 2008; International Application No. PCT/JP2005/023021; 6 Pages.

PCT English Translation of "International Preliminary Report on Patentability"; Date of issuance Jun. 28, 2008; International Application No. PCT/JP2005/023021; 7 Pages.

* cited by examiner

FIG. 9

| CELL BLOCK BL ADDRESS | W3 01234567 | W0 01234567 | W1 01234567 | W2 01234567 | W3 01234567 | W0 01234567 | |
|---|---|---|---|---|---|---|---|
| PROGRAM | 1 | 1 | 1 | 1 | 1 | 1 | |
| BL SELECTED Ssel1 | SSXXXXXX | SSXXXXXX | FFFFFFFF | FFFFFFFF | FFFFFFFF | PPFFFFFF | S: SELECT |
| Dsel1 | XXSSXXXX | XXSSXXXX | FFFFFFFF | FFFFFFFF | FFFFFFFF | SSXXXXXX | X: UNSELECT |
| VOLTAGE APPLIED TO BL  PrePGM | FFFFFFFF | PPFFFFFF | FFFFFFFF | FFFFFFFF | FFFFFFFF | PPFFFFFF | S: 0V |
| S0PGM | FFFFFFFF | DDSSFFFF | FFFFFFFF | FFFFFFFF | FFFFFFFF | DDSSFFFF | D: V write |
| S1PGM | FFFFFFFF | FFFFFFFF | FFPPFFFF | FFFFFFFF | FFFFFFFF | FFFFFFFF | P: Vcc |
| S2PGM | FFPPFFFF | FFFFFFFF | FFFFFFFF | FFPPFFFF | FFFFFFFF | FFFFFFFF | F: FLOAT |
| S3PGM | SSDDFFFF | FFFFFFFF | SSDDFFFF | FFFFFFFF | SSDDFFFF | FFFFFFFF | |

FIG. 10

| CELL BLOCK BL ADDRESS | W3 01234567 | W0 01234567 | W1 01234567 | W2 01234567 | W3 01234567 | W0 01234567 | |
|---|---|---|---|---|---|---|---|
| PROGRAM | 1 | 1 | 1 | 0 | 1 | 0 | |
| BL SELECTED Ssel1 | SSXXXXXX | SSXXXXXX | FFFFFFFF | FFFFFFFF | FFFFFFFF | PPFFFFFF | S: SELECT |
| Dsel1 | XXSSXXXX | XXSSXXXX | FFFFFFFF | FFFFFFFF | FFFFFFFF | SSXXXXXX | X: UNSELECT |
| VOLTAGE APPLIED TO BL  PrePGM | FFFFFFFF | PPFFFFFF | FFFFFFFF | FFFFFFFF | FFFFFFFF | PPFFFFFF | S: 0V |
| S0PGM | FFFFFFFF | DDSSFFFF | FFFFFFFF | PPFFFFFF | FFFFFFFF | FFFFFFFF | D: V write |
| S1PGM | FFFFFFFF | FFFFFFFF | FFPPFFFF | FFFFFFFF | FFFFFFFF | FFFFFFFF | P: Vcc |
| S2PGM | FFPPFFFF | FFFFFFFF | FFFFFFFF | FFFFFFFF | FFPPFFFF | FFFFFFFF | F: FLOAT |
| S3PGM | SSDDFFFF | FFFFFFFF | SSDDFFFF | FFFFFFFF | SSDDFFFF | FFFFFFFF | |

FIG. 11

| CELL BLOCK BL ADDRESS | | W3 01234567 | W0 01234567 | W1 01234567 | W2 01234567 | W3 01234567 | W0 01234567 | |
|---|---|---|---|---|---|---|---|---|
| BL SELECTED | | | | | | | | |
| S3PGM | Ssel1 | ssxxxxxx | xxssxxxx | ssxxxxxx | xxssxxxx | ssxxxxxx | xxssxxxx | S: SELECT |
| | Dsel1 | xxssxxxx | ssxxxxxx | xxssxxxx | ssxxxxxx | xxssxxxx | ssxxxxxx | X: UNSELECT |
| PGMSU | Ssel1 | xssxxxxx | xxxssxxx | xssxxxxx | xxxssxxx | xssxxxxx | xxxssxxx | |
| | Dsel1 | xxxssxxx | xssxxxxx | xxxssxxx | xssxxxxx | xxxssxxx | xssxxxxx | |
| S0PGM | Ssel1 | xssxxxxx | xxxssxxx | xssxxxxx | xxxssxxx | xssxxxxx | xxxssxxx | |
| | Dsel1 | xxxssxxx | xssxxxxx | xxxssxxx | xssxxxxx | xxxssxxx | xssxxxxx | |

FIG. 12

| CELL BLOCK BL ADDRESS | | W3 01234567 | W0 01234567 | W1 01234567 | W2 01234567 | W3 01234567 | W0 01234567 | |
|---|---|---|---|---|---|---|---|---|
| PROGRAM | | 1 | 1 | 1 | 0 | 1 | 1 | |
| BL SELECTED | Ssel1 | ssxxxxxx | xxssxxxx | ssxxxxxx | xxssxxxx | ssxxxxxx | xxssxxxx | S: SELECT |
| | Dsel1 | xxssxxxx | ssxxxxxx | xxssxxxx | ssxxxxxx | xxssxxxx | ssxxxxxx | X: UNSELECT |
| VOLTAGE APPLIED TO BL | PrePGM | FFFFFFFF | PPFFFFFF | FFFFFFFF | FFFFFFFF | FFFFFFFF | PPFFFFFF | S: 0V |
| | S0PGM | FFFFFFFF | DDSSFFFF | FFFFFFFF | FFFFFFFF | FFFFFFFF | FFFFFFFF | D: V write |
| | S1PGM | FFFFFFFF | FFFFFFFF | FFPPFFFF | FFSSFFFF | FFFFFFFF | FFFFFFFF | P: Vcc |
| | S2PGM | FFPPFFFF | FFFFFFFF | SSDDFFFF | FFFFFFFF | FFFFFFFF | FFFFFFFF | F: FLOAT |
| | S3PGM | SSDDFFFF | FFFFFFFF | FFFFFFFF | FFFFFFFF | FFPPFFFF | FFFFFFFF | |

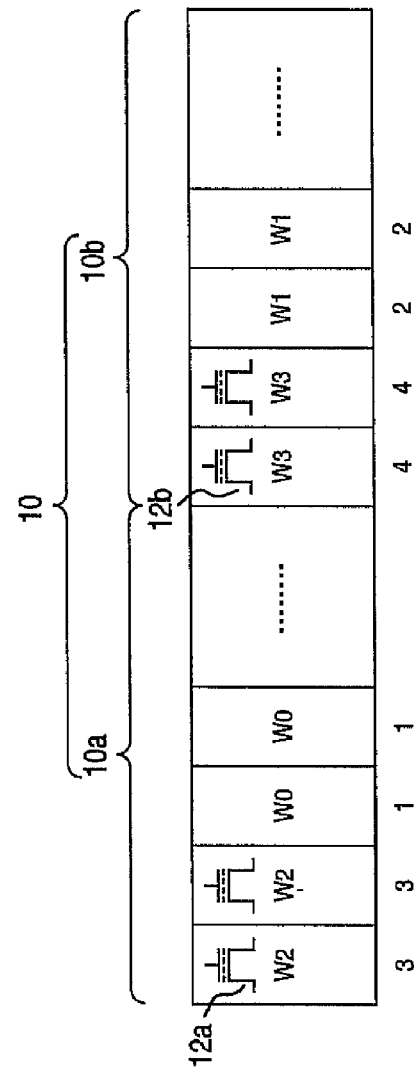

| CELL BLOCK BL ADDRESS | W3 01234567 | W0 01234567 | W1 01234567 | W2 01234567 | W3 01234567 | W0 01234567 | |
|---|---|---|---|---|---|---|---|
| PROGRAM | 1 | 1 | 1 | 1 | 1 | 1 | |
| BL SELECTED Ssel1 | SSXXXXXX | XXSSXXXX | SSXXXXXX | XXSSXXXX | SSXXXXXX | XXSSXXXX | S: SELECT |
| Dsel1 | XXSSXXXX | SSXXXXXX | XXSSXXXX | SSXXXXXX | XXSSXXXX | SSXXXXXX | X: UNSELECT |
| VOLTAGE APPLIED TO BL PrePGM | FFPPFFFF | PPFFFFFF | FFPPFFFF | FFFFFFFF | FFPPFFFF | FFPPFFFF | S: 0V |
| S0PGM | FFPPFFFF | DDSSFFFF | FFPPFFFF | PPFFFFFF | FFPPFFFF | DDSSFFFF | D: V write |
| S1PGM | FFFFFFFF | PPFFFFFF | FFPPFFFF | FFFFFFFF | FFFFFFFF | PPFFFFFF | P: Vcc |
| S2PGM | FFPPFFFF | FFPPFFFF | SSDDFFFF | DDSSFFFF | FFPPFFFF | FFPPFFFF | F: FLOAT |
| S3PGM | SSDDFFFF | FFFFFFFF | FFFFFFFF | FFFFFFFF | SSDDFFFF | FFFFFFFF | |

SEMICONDUCTOR DEVICE AND METHOD OF CONTROLLING THE SAME

CROSS-REFERENCES TO RELATED APPLICATIONS

This is a divisional application of U.S. patent application Ser. No. 11/637,260 entitled "Semiconductor Device and Method of Controlling the Same", by YANO et al., filed Dec. 11, 2006, which is hereby incorporated by reference in its entirety. The U.S. patent application Ser. No. 11/637,260 is a continuation in part of International Application No. PCT/JP2005/023021, filed Dec. 15, 2005, which was not published in English under PCT Article 21(2).

FIELD OF THE INVENTION

The present invention generally relates to a semiconductor device and a method of controlling the semiconductor device, and more particularly, to a semiconductor device having non-volatile memory cells and a method of controlling the semiconductor device.

BACKGROUND OF THE INVENTION

In recent years, non-volatile memories that are data-rewritable semiconductor devices have been widely used for various electronic devices such as portable telephone devices and digital cameras. As an example of a non-volatile memory, U.S. Pat. No. 6,011,725 discloses a SONOS (Silicon Oxide Nitride Oxide Silicon) flash memory that includes virtual ground memory cells that are symmetrically operated, with the sources and the drains being switched.

In this flash memory, bit lines also serve as sources and drains, and are formed with a diffusion layer embedded in a semiconductor substrate. Word lines also serve as control gates. Data writing in a memory cell is performed by applying a high voltage to the drain and the control gate of the transistor that forms the memory cell, and injecting hot electrons to a trapping layer that is a charge accumulating layer. As the writing is performed while the source and the drain are switched, two bits can be stored in each one memory cell. As electrons are injected and captured in the charge accumulating layer, the threshold voltage of the transistor that forms the memory cell becomes higher. Reading of data from a memory cell is performed by applying a predetermined voltage to the gate of the transistor, and detecting the current flowing between the source and the drain.

In a NAND flash memory, which is one type of flash memory, writing and reading are collectively performed for each one page (2 Kbytes, for example). Therefore, a NAND flash memory has a page buffer that holds page data and collectively writes page data from the page buffer into the memory cell array. Also, such a NAND flash memory collectively reads the page data from the memory cell array into the page buffer. A NAND flash memory normally includes memory cells each having a floating gate as a charge accumulating layer. Writing in a memory cell is performed by generating a high potential between the control gate on the floating gate and the substrate so as to cause a FN tunneling phenomenon. Accordingly, a large amount of data of one page can be written at once.

Japanese Patent Publication No. 11-273388 discloses a flash memory in which the bit lines to which voltage for data writing is to be applied are precharged before data is written in memory cells.

When data writing, data reading, or data erasing is performed in the virtual ground memory cells in a flash memory, the voltage to be applied to the memory cells should be kept constant, leakage current between the memory cells should be restrained, and the precharging of the bit lines connected between the memory cells should be performed quickly.

SUMMARY OF THE INVENTION

The present invention has been made to overcome the above drawbacks of the prior art and has an object of providing a semiconductor device that can keep constant the voltage to be applied to the memory cells, restrain leakage current between the memory cells, and quickly precharge the bit lines connected between the memory cells, when data writing, data reading, or data erasing is performed in the memory cells in a flash memory having the non-volatile memory cells. The present invention also provides a method of controlling such a semiconductor device.

According to a first aspect of the present invention, there is provided a semiconductor device including: a memory cell array that includes non-volatile memory cells; a first selecting circuit that connects or disconnects a source and a drain of a transistor to or from a first power supply, wherein the transistor forms one of the memory cells; and a second selecting circuit that connects or disconnects the source and drain to or from a second power supply, the first selecting circuit and the second selecting circuit being arranged on the opposite sides of the memory cell array. The lengths of the routes from the first power supply to the second power supply can be made substantially uniform, regardless of the positions of the memory cells. Accordingly, the decreases in voltage due to the resistance of the routes can also be made uniform, regardless of the positions of the memory cells. Thus, the voltage to be applied to the memory cells can be kept constant.

According to a second aspect of the present invention, there is provided a method of controlling a semiconductor device that includes: a memory cell array that includes non-volatile memory cells; a first power supply and a second power supply that apply voltage to bit lines connected to sources and drains of transistors that form the memory cells; a first storage unit that stores first selecting information that indicates whether the bit lines are to be connected to the first power supply; and a second storage unit that stores second selecting information that indicates whether the bit lines are to be connected to the second power supply, the method including the steps of: connecting the first storage unit and the second storage unit to the bit lines; and transferring the first selecting information from the first storage unit to the second storage unit via the bit lines. The voltage to be applied to the memory cells can be kept constant, and leakage current between the memory cells can be restrained. Furthermore, there is no need to prepare a special line for transferring the first selecting information from the first storage unit to the second storage unit, and accordingly, the circuit area can be shortened.

According to a third aspect of the present invention, there is provided a semiconductor device including: a memory cell array that includes non-volatile memory cells; bit lines that are connected to sources and drains of transistors that form the memory cells; a first region and a second region that are contained in the memory cell array, are physically separated from each other, and have different ones of the bit lines from each other; and a control circuit that writes data alternately in the memory cells of the first region and in the memory cells of the second region. Voltage is not applied to memory cells in the vicinity, and leakage current between the bit lines connected to the memory cells can be restrained.

According to a fourth aspect of the present invention, there is provided a method of controlling a semiconductor device that includes: a memory cell array that includes non-volatile memory cells; bit lines that are connected to sources and drains of transistors that form the memory cells; and a first region and a second region that are contained in the memory cell array, are physically separated from each other, and have different ones of the bit lines from each other, the method including the steps of: writing data in a first memory cell contained in the first region; writing data in a second memory cell contained in the second region; the step of writing data in the first memory cell and the step of writing data in the second memory cell are alternately repeated. Voltage is not applied to memory cells in the vicinity, and leakage current between the bit lines connected to the memory cells can be restrained.

According to a fifth aspect of the present invention, there is provided a semiconductor device including: a memory cell array that includes non-volatile memory cells; bit lines that are connected to sources and drains of transistors that form the memory cells; word lines that are connected to gates of the transistors; a plurality of divided regions that are contained in the memory cell array, each of the divided regions having memory cells connected to the same one of the word lines, data being read simultaneously from the memory cells of the same one of the divided regions; a plurality of sub divided regions that are contained in each of the divided regions, each of the sub divided regions having memory cells connected to the same one of the word lines, data being written simultaneously in the memory cells of the same one of the sub divided regions; a plurality of cell blocks each having at least one bit contained in each of the divided regions, memory cells in each of the cell blocks being physically adjacent to one another; and a connecting circuit that connects bit lines connected to neighboring memory cells to each other in the divided region. The bit lines connected to neighboring memory cells in a divided region can be connected to each other or disconnected from each other.

According to a sixth aspect of the present invention, there is provided a method of controlling a semiconductor device that includes: a memory cell array that includes non-volatile memory cells; bit lines that are connected to sources and drains of transistors that form the memory cells; word lines that are connected to gates of the transistors; a plurality of divided regions that are contained in the memory cell array, each of the divided regions having memory cells connected to the same one of the word lines, data being read simultaneously from the memory cells of the same one of the divided regions; a plurality of sub divided regions that are contained in each of the divided regions, each of the sub divided regions having memory cells connected to the same one of the word lines, data being written simultaneously in the memory cells of the same one of the sub divided regions; and a plurality of cell blocks each having at least one bit contained in each of the divided regions, memory cells in each of the cell blocks being physically adjacent to one another, the method including the steps of: connecting a first bit line that is a bit line connected to a first memory cell that is a memory cell in which data is to be written, to a second bit line that is a bit line connected to a second memory cell that is a memory cell adjacent to the first memory cell in the divided region; precharging the first bit line and the second bit line; and writing the data in the first memory cell. In accordance with this invention, the first bit line connected to the memory cell in which data is to be written can be quickly boosted. The first bit line connected to the memory cell in which data is to be written can be quickly boosted.

BRIEF DESCRIPTION OF THE DRAWINGS

FIG. 9 illustrates an operation to be performed when divided data is written in a divided region in the memory cell array;

FIG. 10 illustrates another example of an operation to be performed when divided data is written in a divided region in the memory cell array;

FIG. 11 illustrates yet another example of an operation to be performed when divided data is written in a divided region in the memory cell array;

FIG. 12 illustrates the problems with the comparative example;

FIG. 15 illustrates an operation to be performed when divided data is written in a divided region in the memory cell array;

FIG. 16 shows the structure of the memory cell array of a flash memory in accordance with a fourth embodiment;

FIG. 17 illustrates an operation when divided data is written in a divided region in the memory cell array;

DESCRIPTION OF THE PREFERRED EMBODIMENTS

A description will now be given, with reference to the accompanying drawings, of embodiments of the present invention.

First Embodiment

Figure 1:
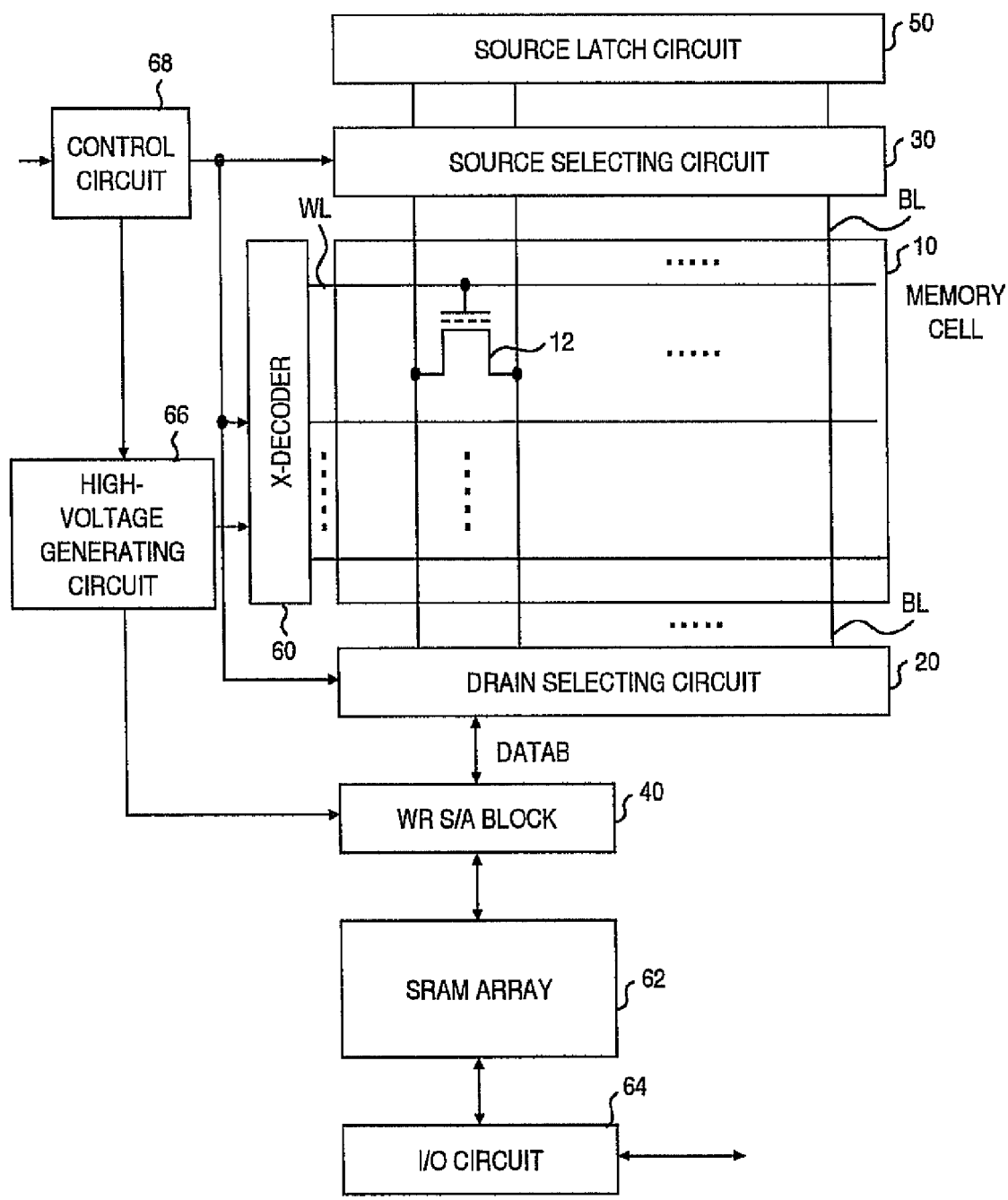
FIG. 1 is a block diagram showing the vicinities of the memory cell array of a flash memory in accordance with a first embodiment.

A first embodiment of the present invention is an example of a virtual ground flash memory. The memory cell array structure of a virtual ground flash memory is a type of NOR flash memory. However, the virtual ground flash memory of the first embodiment has a NAND interface function, and can input and output data to external circuits by page (2 Kbytes). FIG. 1 is a block diagram of the vicinities of the memory cell array of the flash memory in accordance with the first embodiment. A memory cell array 10 has non-volatile virtual ground memory cells 12 that are arranged in a matrix fashion. The sources and drains of the transistors that form the memory cells 12 are connected to bit lines BL, and the gates of the memory cells 12 are connected to word lines WL. Each of the memory cells 12 has a charge accumulation layer made of insulating film. One bit of data can be stored in each of the regions on the source side and the drain side, and a total of 2 bits can be stored in the source and drain regions. The number of memory cells connected to the same word line WL is about 4000, and approximately 16000 bits of data equivalent to approximately 8000 memory cells connected to two word lines WL, which are approximately 2 Kbytes, are contained in the data of each one page. Hereinafter, the source and the drain will be referred to as the source/drain, since the source and drain of the transistor of each memory cell 12 can be switched. However, each source/drain that functions as a drain will be referred to as a drain, and each source/drain that functions as a source will be referred to as a source. Further, the source/drain of the transistor of each memory cell 12 will be referred to simply as the source/drain of each memory cell 12.

The bit lines BL are connected to a drain selecting circuit 20 and a source selecting circuit 30. The drain selecting circuit 20 connects and disconnects the bit lines BL to and from a power supply to be connected to the drains, at the time of writing, reading, or erasing data in the memory cells 12. The source selecting circuit 30 connects and disconnects the bit lines BL to and from a power supply (the ground here) to be connected to the sources. The X-decoder 60 is connected to the word lines WL. At the time of writing, reading, or erasing data in the memory cells 12, the drain selecting circuit 20, the source selecting circuit 30, and the X-decoder 60 select some of the memory cells 12 in which writing, reading, or erasing is to be performed in accordance with an instruction from the control circuit 68. The high-voltage generating circuit 66 that generates a high voltage in accordance with an instruction from the control circuit 68 applies a voltage to the gate and the drain of the selected memory cells 12 via the X-decoder 60 and the WR S/A block 40. The source of the memory cells 12 is grounded. In this manner, writing, reading or erasing is performed on the memory cells 12.

The WR S/A block 40 has a sense amplifier for reading data from the memory cells 12, and a WR latch circuit that holds data when data is written in the memory cells 12. A data line DATAB is connected to the WR latch circuit. The source latch circuit 50 temporarily holds data when data is written into the memory cells 12.

When data is read from the memory cells 12, the drain selecting circuit 20 and the source selecting circuit 30 select the memory cells 12 equivalent to 512 bits among the data of one page. The 512 bits of data are stored in a SRAM array 62 via the WR S/A block 40. Hereinafter, the 512-bit data will be referred to as a set of divided data, and each region to contain 512 bits of data among one page will be referred to as a divided region. Each divided region and each set of divided data also include the reference cell bits and the spare data bits for management that are not shown in the drawings for ease of explanation. Thirty-two sets of divided data are stored in the SRAM array 62, which outputs the data of one page to the outside via an I/O circuit 64.

When data is written into the memory cells 12, the data of one page (2 Kbytes) from the outside is stored in the SRAM array 62 via the I/O circuit 64. A set of divided data (512 bits, for example) among the data of the one page is stored in the WR latch circuit in the WR S/A block 40 via the DATAB. In one embodiment, data of 128 bits is then written from the WR S/A block 40 into memory cells selected from the memory cell array 10 by the drain selecting circuit 20 and the source selecting circuit 30. This is repeated four times, so as to write the 512-bit divided data into a divided region. This writing of divided data is repeated 32 times, so as to write the data of the one page from the SRAM array 62 into the memory cell array 10. Hereinafter, each set of 128-bit data will be referred to as a sub set of divided data (sub divided data), and a region to contain 128 bits of data in a divided region will be referred to as a sub divided region. One page, one set of divided data, and one sub set of divided data can be arbitrarily set, and are not limited to the above described examples.

As described above, writing in the memory cell array 10 is performed for each sub set of 128-bit divided data in the first embodiment for the following reasons. In a general NAND flash memory, a FN tunneling phenomenon is utilized to write data, and accordingly, the data can be written into the memory cells with a small amount of current. On the other hand, a hot electron phenomenon is utilized to write data into virtual ground memory cell as in the first embodiment, and therefore, a large amount of current is needed to write data into the memory cells. As a result, the amount of data that can be written into memory cells at the same time is limited to 128 bits, for example.

Figure 2:
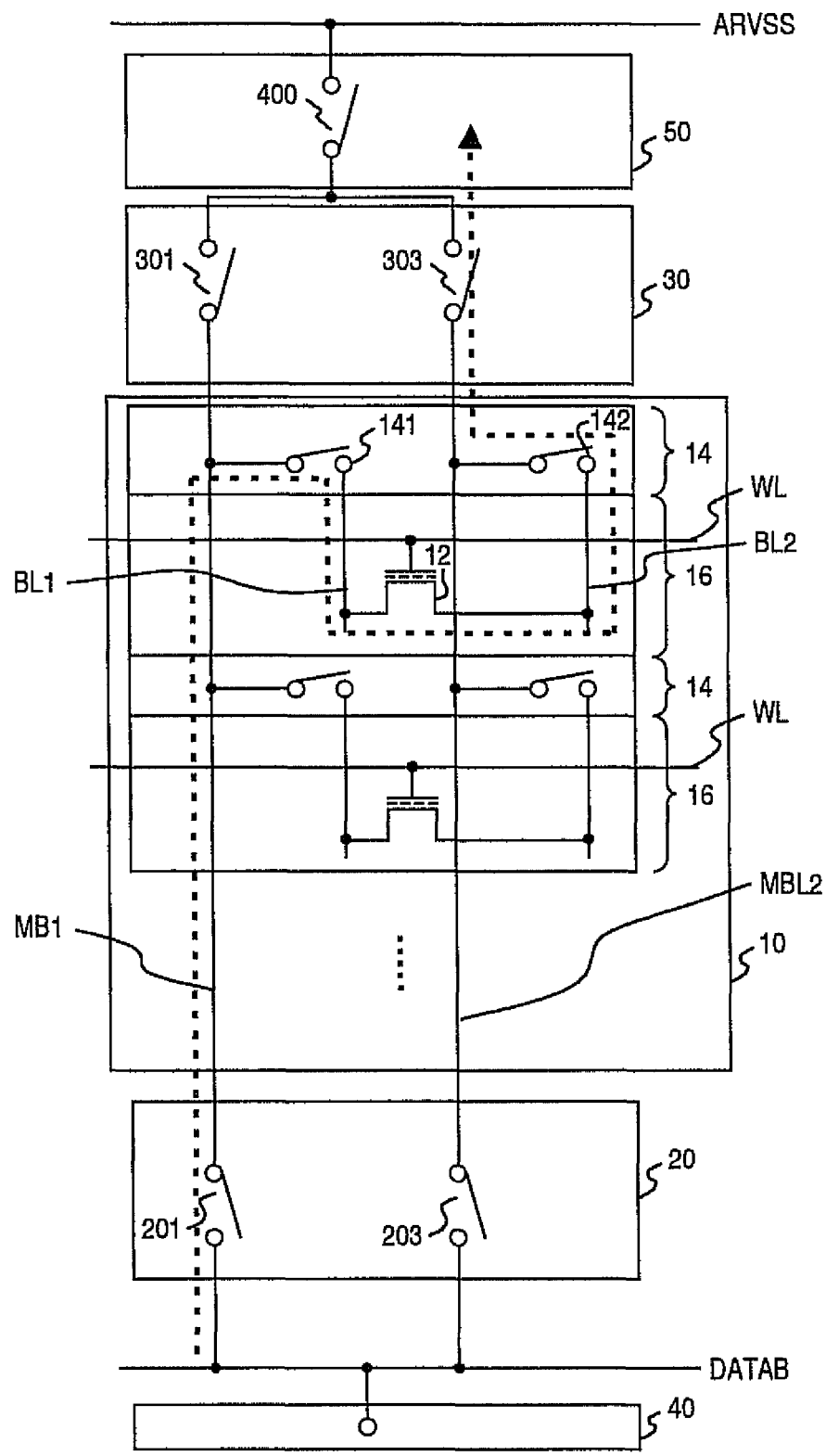
FIG. 2 is a schematic view of the memory cell array, the drain selecting circuit, and the source selecting circuit in accordance with the first embodiment.

Referring now to FIG. 2, the roles of the drain selecting circuit 20 and the source selecting circuit 30 of the flash memory in accordance with the first embodiment are described. The memory cell array 10 includes sectors 16. In each of the sectors 16, 512 word lines WL and 4000 bit lines BL are provided. Accordingly, each one sector 16 has a memory size of about 4 Mbits. For ease of explanation, just one memory cell 12 is described here. The source and drain of the memory cell 12 are connected to bit lines BL1 and BL2 that are formed with diffusion layers. The bit lines BL1 and BL2 are connected to main bit lines MBL1 and MBL2 with switches 141 and 142 of a sector selecting circuit 14. In this manner, the sector selecting circuits 14 select one of the sectors 16, and the main bit lines MBL select one of the bit lines BL of the selected sector 16.

The drain selecting circuit 20 and the WR S/A block 40 are placed below the memory cell array 10 in FIG. 2, and the source selecting circuit 30 and the source latch circuit 50 are placed on the other side of the memory cell array 10. The data line DATAB is connected to the WR S/A block 40, and the WR S/A block 40 is connected to the main bit lines MBL1 and MBL2 via switches 201 and 203 of the drain selecting circuit 20. The main bit lines MBL1 and MBL2 are connected to the source latch circuit 50 via switches 301 and 303 of the source selecting circuit 30, and are also connected to a ground line ARVSS via a switch 400 in the source latch circuit 50.

When data is written into the memory cell 12, the drain selecting circuit 20 connects the main bit line MBL1 to the data line DATAB having a high voltage via the WR S/A block 40. The sector selecting circuit 14 connects the main bit line MBL1 to the bit line BL1 in the selected sector 16, and to the memory cell 12. Meanwhile, the source selecting circuit 30 and the source latch circuit 50 connect the main bit line MBL2 to the ground. The sector selecting circuit 14 connects the main bit line MBL2 to the bit line BL2, and to the memory cell 12. In this manner, the drain of the transistor forming the memory cell 12 is connected to the data line DATAB, and the source is connected to the ground line ARVSS. The operation of the source latch circuit 50 will be described later. The gate of the memory cell 12 is connected to a word line WL. The X-decoder 60 selects the word line WL to which the memory cell 12 is to be connected, and a high voltage generated from the high-voltage generating circuit 66 is applied to the gate. As the high voltage generated from the high-voltage generating circuit 66 is applied to the data line DATAB, the data is written into the memory cell 12. The flow of the current from the DATAB to the ground line ARVSS is indicated by the dotted line with an arrow in FIG. 2.

As described above, in the first embodiment, the drain selecting circuit 20 (the first selecting circuit) connects and disconnects the source and drain that contained in the memory cell 12 to the data line DATAB to and from the high-voltage generating circuit 66 (the first power supply) for writing data. The source selecting circuit 30 connects and disconnects the source and drain of the transistor to and from the ground line ARVSS (the second power supply). The drain selecting circuit 20 and the source selecting circuit 30 are provided on the opposite sides of the memory cell array 10.

Figure 3A:
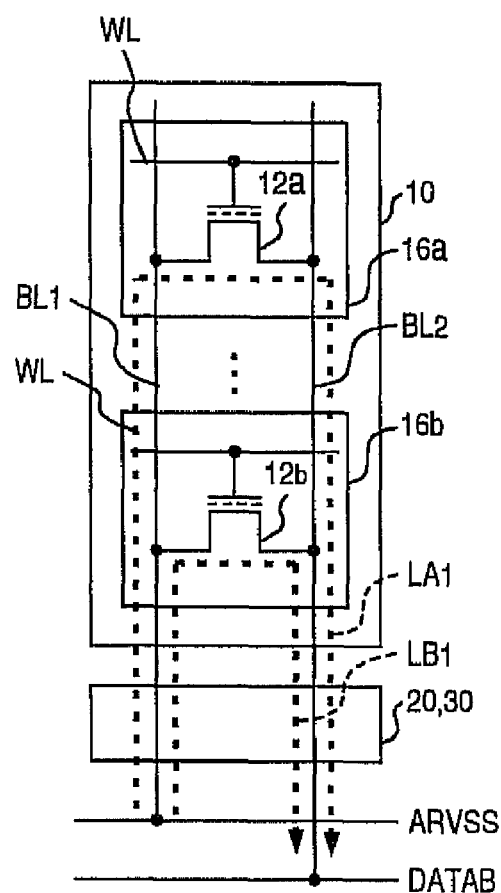
FIG. 3A shows the flow of current when data is written in a comparative example.
Figure 3B:
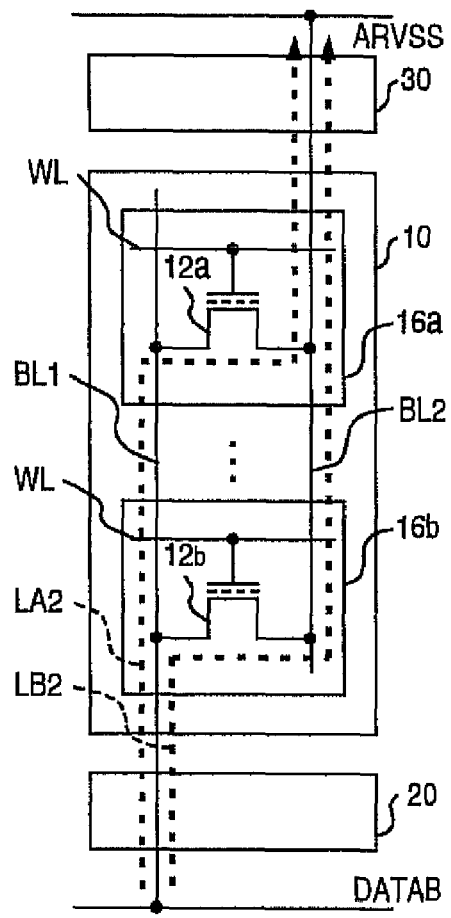
FIG. 3B shows the flow of current in the first embodiment.

FIGS. 3A and 3B are schematic views illustrating the effects of the arrangement of the drain selecting circuit 20 and the source selecting circuit 30 provided on the opposite sides of the memory cell array 10. FIG. 3A shows an example case (a comparative example) where the drain selecting circuit 20 and the source selecting circuit 30 are provided on the same side of the memory cell array 10. A route LA1 is the route from the data line DATAB to the ground line ARVSS in a case where a memory cell 12a in a sector 16a located at a distance from the drain selecting circuit 20 and the source selecting circuit 30 is selected, and a route LB1 is the route used in a case where a memory cell 12b in a sector 16b close to the drain selecting circuit 20 and the source selecting circuit 30 is selected. The difference in length between the route LA1 and the route LB1 is large. Therefore, there is also a large difference in the voltage decrease due to the resistance of the bit lines BL1 and BL2 between the route LA1 and the route LB1. As a result, the difference between the voltages to be applied to the memory cells 12a and 12b becomes large.

Meanwhile, FIG. 3B illustrates the case of the first embodiment. The drain selecting circuit 20 and the source selecting circuit 30 are provided on the opposite sides of the memory cell array 10. A route LA2 is the route from the data line DATAB to the ground line ARVSS in a case where a memory cell 12a in a sector 16a is selected, and a route LB2 is the route from the data line DATAB to the ground line ARVSS in a case where a memory cell 12b in a sector 16b is selected. Here, the difference in length between the route LA2 and the route LB2 is small. Therefore, there is hardly a difference in the voltage decrease due to the resistance of the bit lines BL1 and BL2 between the route LA2 and the route LB2. As a result, the difference between the voltages to be applied to the memory cells 12a and 12b becomes small. As described above, in the first embodiment, the voltages to be applied to the memory cells at the time of data writing and data reading into and from the memory cells can be kept constant.

Figure 4:
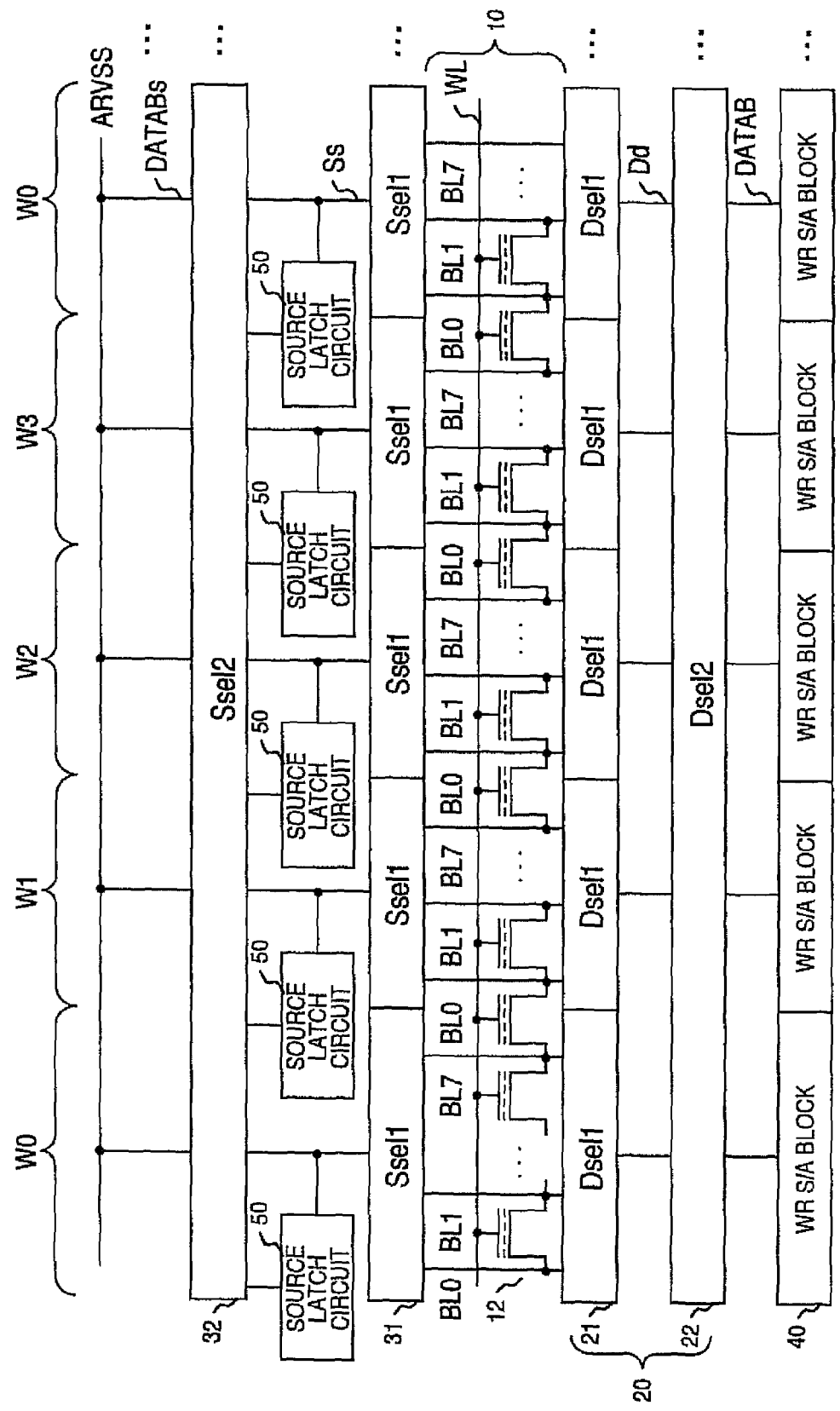
FIG. 4 illustrates the structures of the memory cells of one page.

Referring now to FIG. 4, the memory cells 12 of one page are described. The memory cells 12 of one page are connected to two word lines WL. FIG. 4 shows some of the memory cells 12 connected to one of the two word lines WL. Eight memory cells 12 of 16 bits constitute one cell block. Addresses "0" through "7" are allotted to the right bits of the memory cells 12 in a cell block W0, and addresses "8" through "15" are allotted to the left bits of the memory cells 12 in the cell block W0. Addresses "8" through "15" are allotted to the right bits of the memory cells 12 in a cell block W1 neighboring the cell block W0, and addresses "0" through "7" are allotted to the left bits of the memory cells 12 in the cell block W1. Addresses are allotted to the memory cells 12 in a cell block W2 in the same manner as the addresses allotted to the memory cells 12 in the cell block W0, and addresses are allotted in a cell block W3 in the same manner as in the cell block W1. The right and left addresses are reversed between each two neighboring cell blocks, so as to restrain leakage current between bit lines.

Eight bit lines BL0 through BL7 are connected to each cell block. There are 512 cell blocks connected to one word line WL, and the number of cell blocks W0 is 128. The number of cell blocks W1, the number of cell blocks W2, and the number of cell blocks W3 are also 128. The bits having the same addresses in the 512 cell blocks form a 512-bit divided region. The bits having the same addresses in the 128 cell blocks W0 form a 12-bit sub divided region. The same applies to each of the cell blocks W1, W2, and W3. Reading of divided data from the memory cell array 10 is performed by reading the bits having the same addresses from the cell blocks. Also, data writing into the memory cell array 10 is performed for the cell blocks W0 through W3 independently of one another. Accordingly, each divided region is contained in the memory cell array 10, and includes memory cells connected to the same word line WL and from which data is to be read out at the same time. A sub divided region is contained in each divided region, and includes memory cells connected to the same word line WL and into which data is to be written at the same time. The memory cells in each sub divided region have different bit lines from one another. The memory cells in each cell block are arranged physically adjacent to one another, and each cell block has at least one bit contained in each divided region.

The eight bit lines BL0 through BL7 in each cell block are connected to Dsel1 (21) in the drain selecting circuit 20 and Ssel1 (31) in the source selecting circuit 30. Dsel1 (21) selects a common address from all the cell blocks W0 through W3, and connects the selected bit line to Dsel2 (22) via a connecting line Dd. Likewise, Ssel1 (31) connects a bit line to Ssel2 (30) via a connecting line Ss. Also, Dsel1 (21) and Ssel1 (31) select a common address from all the cell blocks W1 through W3. When data is written into the cell blocks W0, for example, Dsel2 (22) and Ssel2 (32) select all the cell blocks W0, and connects each of the cell blocks W0 to the WR S/A block 40 and the source latch circuit 50. In this manner, at the time of data writing, 128-bit data is written into the memory cell array 10 at the same time.

Figure 5:
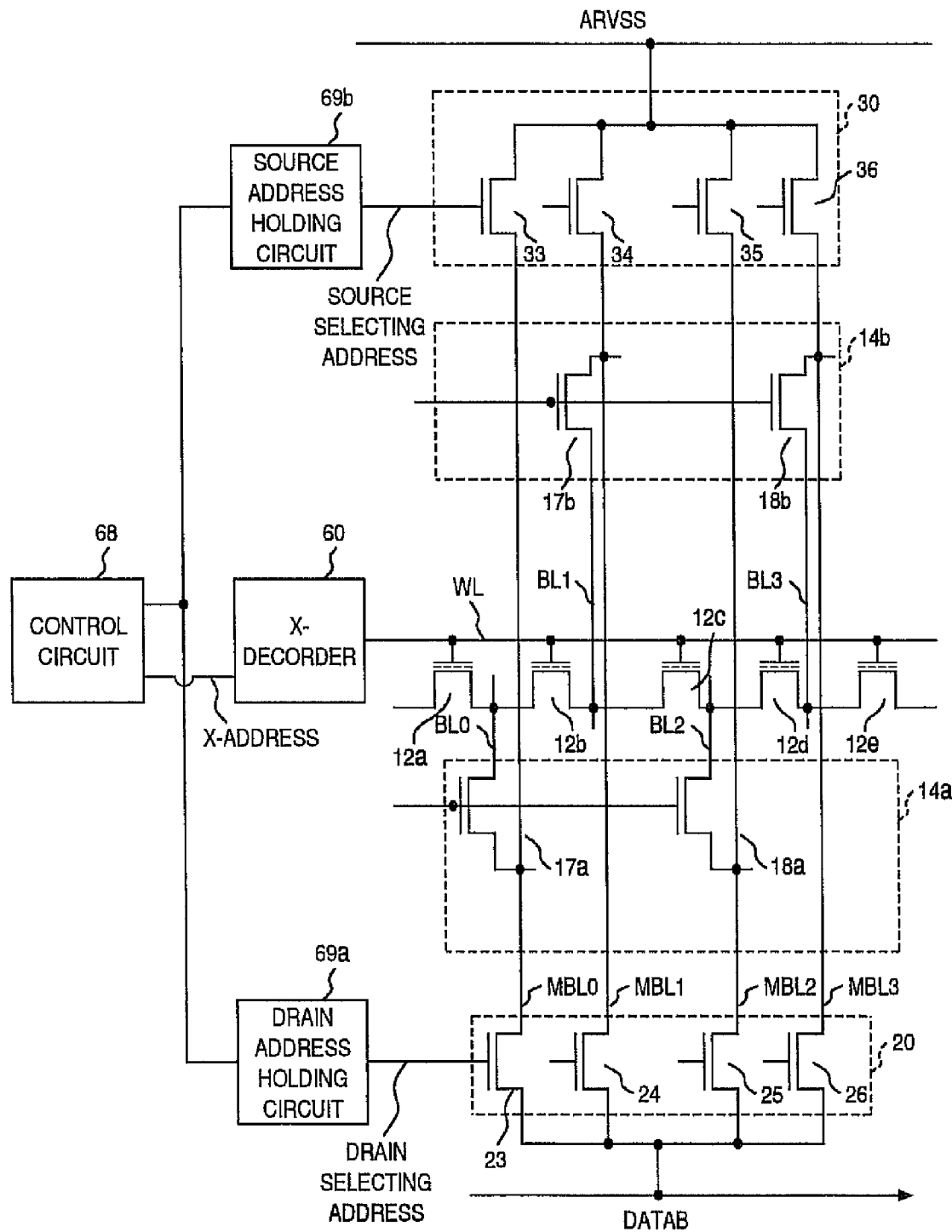
FIG. 5 is the circuit diagram at the time of writing data in memory cells.

FIG. 5 is a circuit diagram of the memory cell array in a cell block. The cell block is formed with eight memory cells and four main bit lines. However, FIG. 5 shows only five memory cells 12a through 12e. One main bit line is connected to two bit lines BL via sector selecting circuits 14a and 14b. A Y-address that is output from the control circuit 68 is input to a source address holding circuit 69b and a drain address holding circuit 69a. The source address holding circuit 69b and the drain address holding circuit 69a cause the source selecting circuit 30 and the drain selecting circuit 20 to select the main bit line corresponding to the Y-address. An X-address that is output from the control circuit 68 is input to the X-decoder 60. The X-decoder 60 selects the word line WL corresponding to the X-address.

The five memory cells 12a through 12e are connected to the word line WL. Here, data writing in the left bit of the memory cell 12c is described. The voltage to be applied to the drain is supplied to the data line DATAB, and is connected to the main bit line MBL0 with a FET 23 in the drain selecting circuit 20. The FET 23 is connected to the bit line BL0 with a FET 17a in the sector selecting circuit 14a, and is then connected to the drain of the memory cell 12b. The data line DATAB is also connected to the main bit line MBL1 with a FET 24 in the drain selecting circuit 20, and is then connected to the bit line BL1 with a FET 17b in the sector selecting circuit 14*b*. The bit line BL1 is then connected to the drain of the memory cell 12*c*. Meanwhile, the ground line ARVSS is connected to the main bit lines MBL2 and MBL3 with FETs 35 and 36 in the source selecting circuit 30, and is then connected to the bit lines BL2 and BL3 with FETs 18*a* and 18*b* in the sector selecting circuits 14*a* and 14*b*, respectively. The bit lines BL2 and BL3 are connected to the right sources of the memory cells 12*c* and 12*d*. In this manner, the data line DATAB is connected to the drain of the memory cell 12*c* in which writing is to be performed, and the ground line ARVSS is connected to the source of the memory cell 12*c*. Further, the data line DATAB and the ground line ARVSS are connected to the drain of the memory cell 12*b* and the source of the memory cell 12*d*. The two bit lines BL are connected to the data line DATAB and the ground line ARVSS, so as to reduce the resistance generated between the data line DATAB and the memory cell 12*c* and the resistance between the ground line ARVSS and the memory cell 12*c*.

Figure 6:
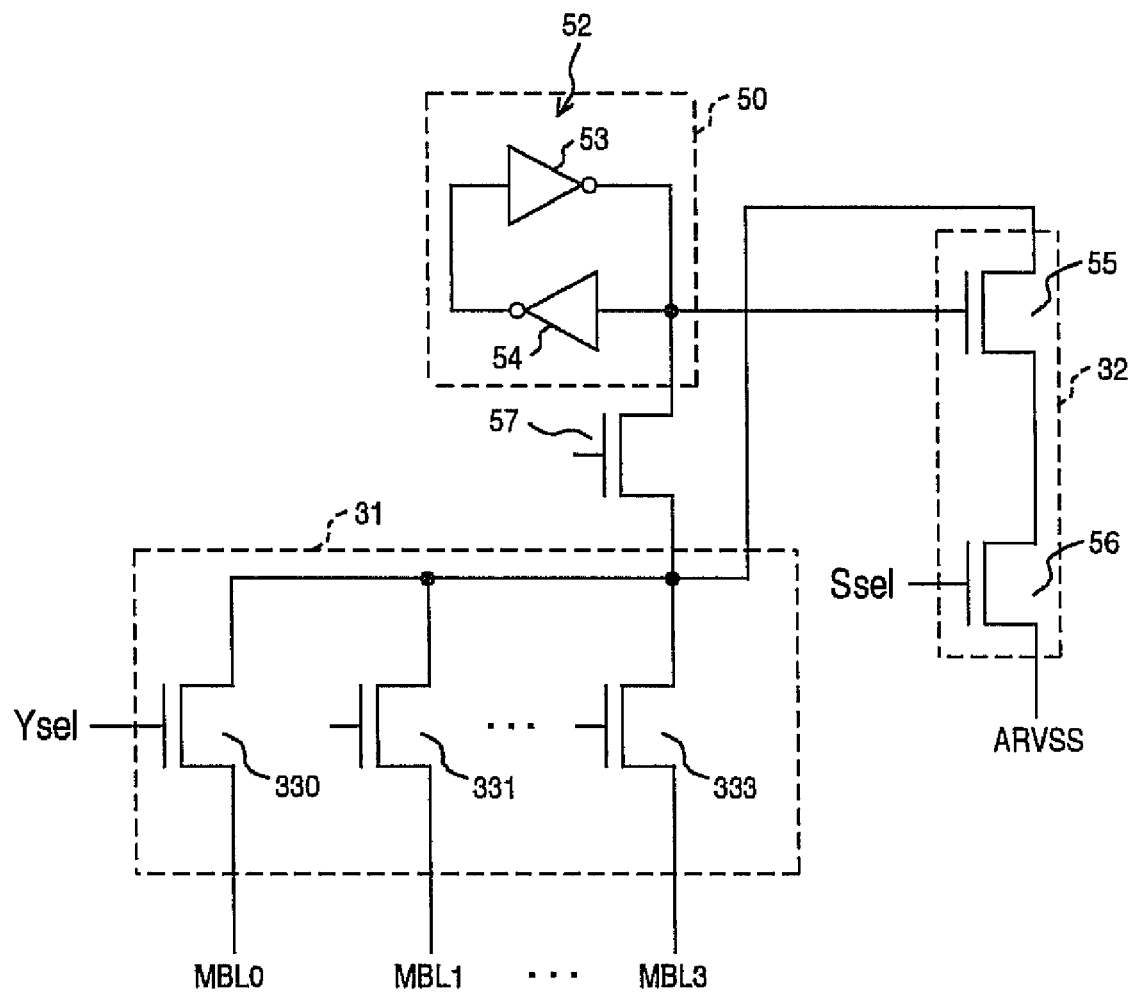
FIG. 6 is the circuit diagram of the vicinities of the source latch circuit.

FIG. 6 is a circuit diagram showing the vicinities of the source latch circuit 50. The source latch circuit 50 can store one set of data in each cell block. The main bit lines MBL0 through MBL3 in the cell block are connected to FETs 330 through 333 in Ssel1 (31) of the source selecting circuit 30. The FETs 330 through 333 connects the corresponding main bit lines MBL0 through MBL3 to a flip-flop 52 in the source latch circuit 50. The flip-flop 52 is formed with inverters 53 and 54. A FET 57 is switched on before writing in the subject divided region is started (at the time of program set-up). Data transmitted through the main bit lines MBL0 through MBL3 selected by Ssel1 (31) is held by the flip-flop 52. Ssel2 (32) includes a FET 56. While writing is performed in the memory cell, the FET 57 is switched off, and the flip-flop 52 controls the FET 55. When the flip-flop 52 is at the low level, the FET 55 is in an OFF state, and the main bit lines MBL0 through MBL3 are in a floating state. When the flip-flop 52 is at the high level, the FET 55 is in an ON state. The FET 56 in the selected cell block is switched on, and the FET 56 in each unselected cell block is switched off. Accordingly, when the FET 55 is in an ON state in the selected cell block, the main bit lines MBL0 through MBL3 selected by the source selecting circuit 30 are connected to the ground line ARVSS. When the FET 55 in the selected cell block is in an OFF state, the main bit lines MBL0 through MBL 3 selected by the source selecting circuit 30 are not connected to the ground line ARVSS.

Figure 7:
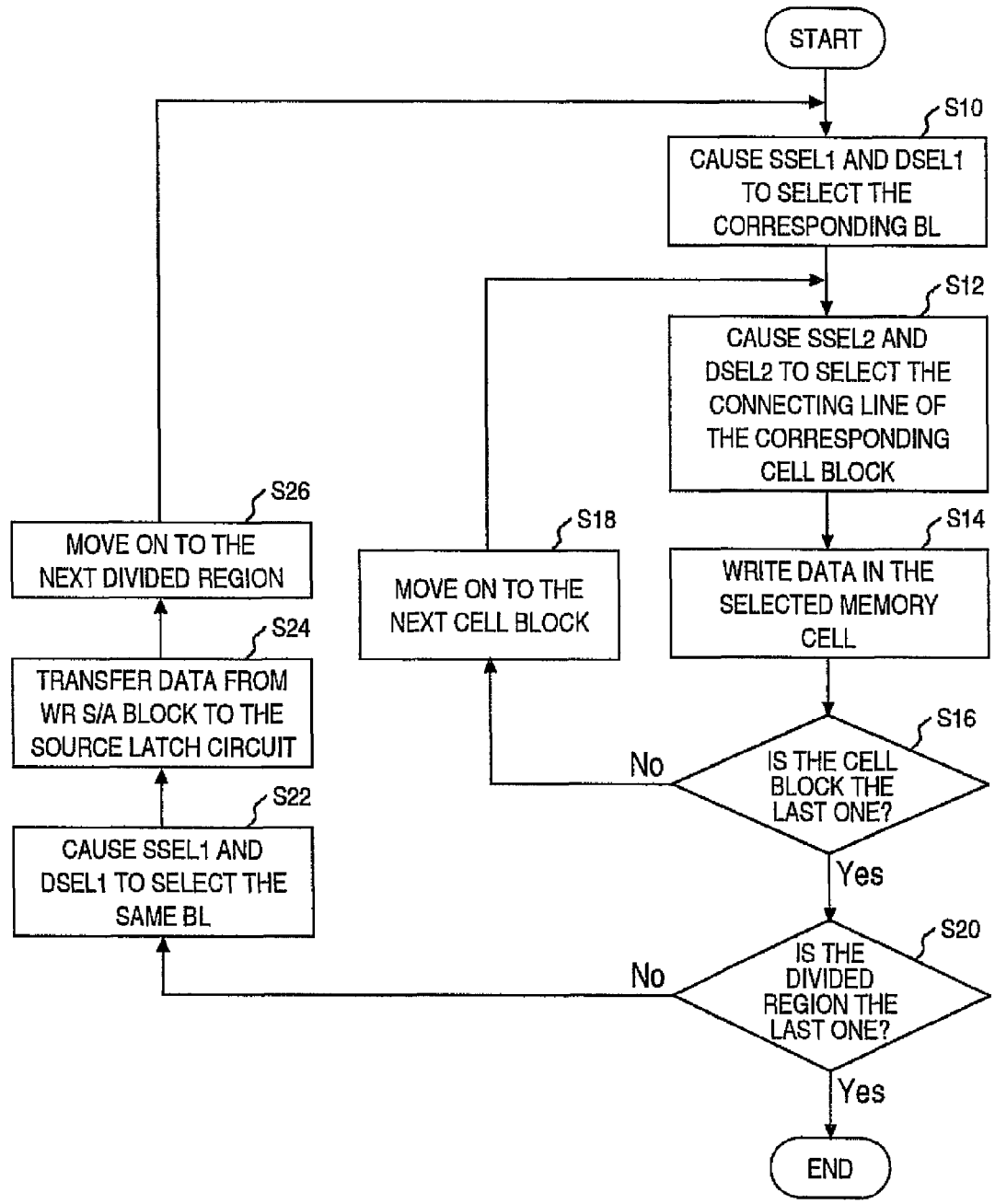
FIG. 7 is a flowchart of an operation to be performed when data is written in memory cells.
Figure 8:
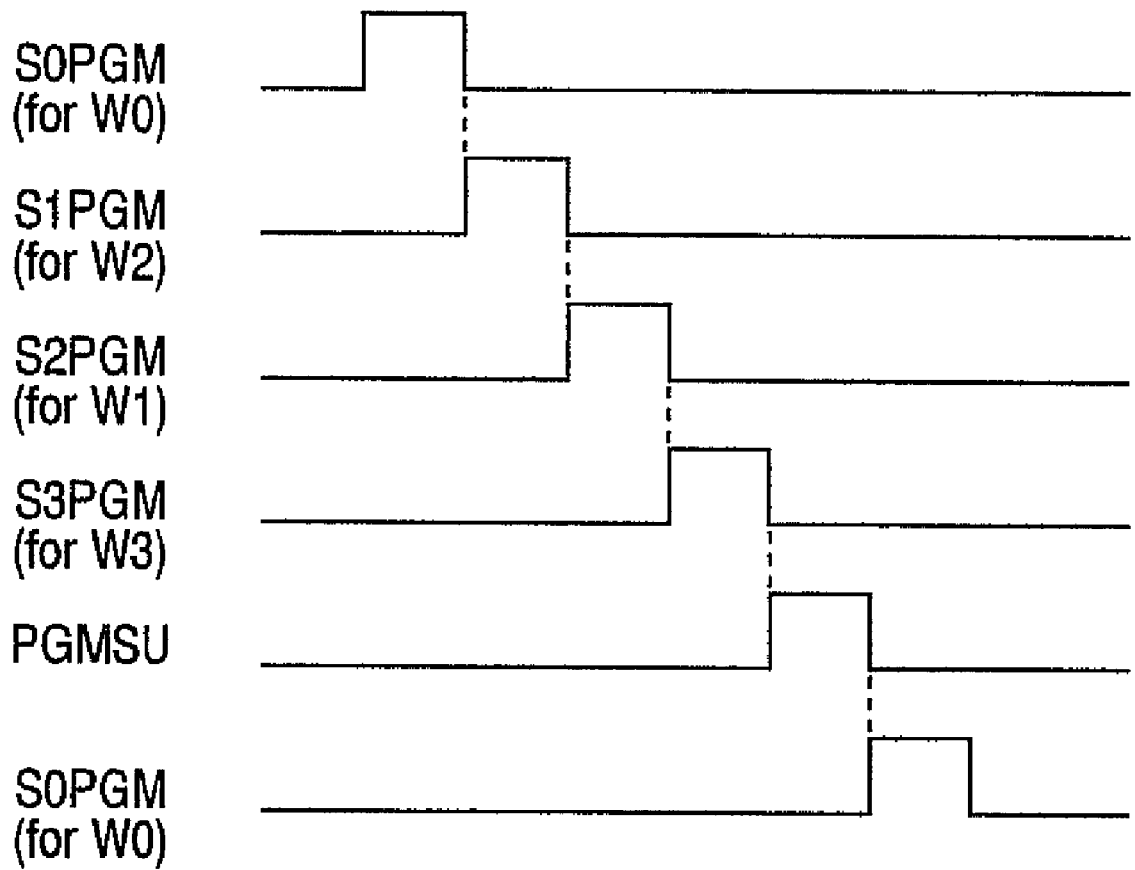
FIG. 8 shows the timing charts of signals for perform writing in the respective cell blocks.

Next, the control operation to be performed when data is written in the memory cell array 10 is described. FIG. 7 is a flowchart of the control operation. FIG. 8 shows the timing charts of signals for performing writing in the respective cell blocks. A signal S0PGM is a signal for performing writing in the cell block W0 at the high level. Likewise, signals S1PGM, S2PGM, and S3PGM are signals for performing writing in the cell blocks W2, W1, and W3, respectively. A signal PGMSU is a program set-up signal.

FIGS. 9 and 10 illustrate the operation to be performed when a set of divided data is written in a divided region in the memory cell array 10. The "BL Address" represents the bit lines BL0 through BL7 in the cell blocks W0 through W3. The "Program" shows the data stored in the WR S/A block 40. In the "program" row, "1" indicates that writing is to be performed, while "0" indicates that writing is not to be performed. Those data are program data that are input from the outside. FIG. 9 shows a case where data is to be written in all the cell blocks. FIG. 10 shows a case where data is not to be written in the cell block W2 and the cell block W0 on the right side, but data is to be written in the other cell blocks. The "Selected Bit Lines BL" indicates the bit lines to be selected by Ssel1 (31) and Dsel1 (21). In this row, each "S" indicates that the subject bit line is to be selected, and each "X" indicates that the subject bit line is not to be selected.

The voltages to be applied to the bit lines BL indicate the conditions when the signals S0PGM through S3PGM for performing writing in the respective cell blocks are at the high level. A signal PrePGM is a part of the signal PGMSU. The operation progresses from the signal PrePGM to the signal S3PTM. Each "S" indicates the voltage of the ground line ARVSS, which is 0 V. Each "D" indicates the voltage Vwrite (4.7 V, for example) to be applied to the drain of the subject memory cell at the time of writing. Each "P" indicates the precharge voltage Vcc (3 V, for example) to be applied to the drain of the subject memory cell. Each "F" indicates a floating state. The cell blocks W0 through W3 framed by rectangles are the cell blocks selected by Ssel2 (32) and Dsel2 (22).

During the time of the signal PrePGM, the bit lines BL0 and BL1 of the cell block W0 connected to the memory cell in which writing is to be performed with S0PGM are precharged with a source voltage.

Referring to FIG. 7, the control circuit 68 causes Ssel1 (31) and Dsel1 (21) to select the bit lines having the address corresponding to the subject divided region (step S10). In the example case shown in FIG. 9, Ssel1 (31) selects the bit lines BL2 and BL3 in the cell blocks W0 and W2, and the bit lines BL0 and BL1 in the cell blocks W1 and W3. Dsel1 (21) selects the bit lines BL0 and BL1 in the cell blocks W0 and W2, and the bit lines BL2 and BL3 in the cell blocks W1 and W3. In FIG. 8, the signal P0PGM becomes high level.

Referring back to FIG. 7, the control circuit 68 causes Ssel2 (32) and Dsel2 (22) to select the corresponding cell block W0 (step S12). In the example case shown in FIG. 9, the cell block W0 is selected during the time of the signal S0PGM. As shown in FIGS. 7 and 9, the control circuit 68 causes the high-voltage generating circuit 66 to generate the voltage Vwrite, and applies the voltage Vwrite to the bit lines BL0 and BL1. A voltage of 0 V is applied to the bit lines BL2 and BL3 connected to the ground line ARVSS. The other bit lines are in a floating state, not being selected by Ssel1 (31) and Dsel1 (21). Also, the other cell blocks W1 through W3 are in a floating state, not being selected by Ssel2 (32) and Dsel2 (22). Data is then written in the memory cells existing between the bit lines BL1 and BL2 in the cell block W0 (step S14). Accordingly, 128-bit data is written at once. At this point, the bit lines BL0 and BL1 in the cell block W2 in which writing is to be performed next are precharged. In this manner, the bit lines BL0 and BL2 can be quickly boosted to the voltage Vwrite when writing is performed in the cell block W2.

The control circuit 68 determines whether writing has been completed in the last cell block (step S16). Since the cell block W0 is not the last cell block, the operation moves on to the next cell block (step S18). As shown in FIG. 8, the signal S1PGM becomes high level, and steps S12 and S14 in FIG. 7 are carried out, so as to perform writing in the cell block W2. Likewise, when the signal S2PGM and the signal S3PGM become high level, writing is performed in the cell blocks W1 and W3, respectively. In this manner, writing is completed in the cell blocks W0 through S3, and 512-bit divided data is written into the divided region in the memory cell array 10.

Next, the example case shown in FIG. 10 where data is not to be written in the cell block W2 and the cell block W0 on the right side is described. In this case, all the bit lines BL0 through BL7 in the cell block W0 on the right side are in a floating state at the time of the signal S0PGM, and the bit lines BL0 through BL7 in the cell block W2 are in a floating state at the time of the signal S1PGM. Accordingly, data is not to be written at that time. Referring to FIG. 7, if the cell block W3 is determined to be the last cell block in step S16, the operation moves on to step S20. The control circuit 68 then determines whether the written data is the last divided data (step S20). If the written data is the last divided data, the operation comes to an end. If not, the operation moves on to step S22.

The procedures in steps S22 and S24 in FIG. 7 are now described, with reference to FIGS. 5 and 11. FIG. 11 shows the bit lines BL0 through BL7 to be selected by Ssel1 (31) and Dsel1 (21) at the times of the signal P3PGM, the signal PGMSU, and the signal S0PGM of the next set of divided data. As described earlier, at the time of the signal S3PGM, Ssel1 (31) selects the bit lines BL0 and BL1 in the cell block W3, for example, and Dsel1 (21) selects the bit lines BL2 and BL3 in the cell block W3, for example. Here, the main bit lines MBL1 and MBL2 are selected.

When the signal PGMSU becomes high level in FIG. 8, the control circuit 68 causes Ssel1 (31) to select the bit lines BL1 and BL2 in the cell block W3, for example, and causes Dsel1 (21) to select the bit lines BL2 and BL3 in the cell block W3, as shown in FIGS. 7 and 11. Here, the main bit lines MBL2 and MBL3 are selected. More specifically, during the time of the signal PGMSU, only the address on the source side moves on to one address ahead of the address selected with the signal S3PGM, and the address on the drain side remains as selected with the signal S3PGM. Accordingly, during the signal PGMSU, the address holding circuits 69a and 69b that discard addresses generated from the control circuit 68 or hold previous addresses are provided on the source side and the drain side, as shown in FIG. 5. In the example shown in FIG. 11, during the signal PGMSU, the drain address holding circuit 69a discards a new address generated by the control circuit 68, and the source address holding circuit 69b holds the previous address in each of the cell blocks W0 and W2. In this manner, the same main bit line MBL2 is selected by Ssel1 (31) and Dsel1 (21) (step S22), as shown in FIG. 5. The WR S/A block 40 and the source latch circuit 50 are connected at the same time via the main bit line MBL2.

Referring back to FIG. 7, the control circuit 68 transfers data from the WR S/A block 40 to the source latch circuit 50 in each of the 512 cell blocks via the main bit lines (step S24). The data is stored in the SRAM array 62 and is transferred to the WR S/A block 40 in step S22. The data is the divided data that belongs to the divided region in which writing is to be performed next. The control circuit 68 then moves on to the next divided region (step S26). As shown in FIGS. 7 and 11, the control circuit 68 causes Ssel1 (31) and Dsel1 (21) to select the bit lines corresponding to the address of the next set of divided data. At the time of the signal S0PGM in FIG. 11, Ssel1 (31) selects the bit lines BL3 and BL4 in the cell blocks W0 and W2, and the bit lines BL1 and BL2 in the cell blocks W1 and W3. Meanwhile, Dsel1 (21) selects the bit lines BL1 and BL2 in the cell blocks W0 and W2, and the bit lines BL3 and BL4 in the cell blocks W1 and W3. Here, if the program data stored in the source latch circuit 50 during the time of the previous signal PGMSU is not the information to be written, the main bit line of the subject cell block is not connected to the ground line ARVSS, and is put into a floating state. The source of each selected memory cell is also put into a floating state. In this manner, the source and drain of each selected memory cell become unconnected to the ground line ARVSS. The operation then moves on to the next set of divided data. After thirty-two sets of divided data are written into the divided regions, the writing of one page is completed.

As described above, the flash memory in accordance with the first embodiment has the WR S/A block 40 (the first storage unit) that is connected to the drain selecting circuit 20 (the first selecting unit) and stores the information indicating whether data is to be written in the subject memory cell, or the information (the first selecting information) indicating whether the high-voltage generating circuit 66 (the first power supply) is to be connected to the data line DATAB connected to the source and drain of the transistor forming the subject memory cell. More preferably, the flash memory in accordance with the first embodiment has the source latch circuit 50 (the second storage unit) that is connected to the source selecting circuit 30 (the second selecting unit) and stores the information (the second selecting information) indicating whether the source and drain is to be connected to the ground line ARVSS (the second power supply) connected to the ground.

FIG. 12 shows the problem caused in a case where the source latch circuit 50 is not provided. The structure illustrated in FIG. 12 is the same as the structure in FIG. 10, except that the source latch circuit 50 is not provided. Since the source latch circuit 50 is not provided, the following problem is caused when data is not written in memory cells. For example, at the time of the signal S1PGM, data is not to be written in the cell block W2, but the information to that effect is not transmitted to the source selecting circuit 30. Therefore, the bit lines BL2 and BL3 remain connected to the ground line ARVSS. As a result, leakage current flows from the pre-charged bit lines BL2 and BL3 of the cell block W1 to the bit lines BL2 and BL3 of the cell block W2 (in the direction indicated by the arrow pointing at the right in FIG. 12). In accordance with the first embodiment, if the information stored in the source latch circuit 50 is "0", the FET 55 shown in FIG. 6 is switched off, and the bit lines BL2 and BL3 of the cell block W2 are put into a floating state. Accordingly, leakage current between the memory cells can be restrained. With virtual ground memory cells having NAND interfaces, the effect of restraining leakage current is particularly large, since the memory cells in which writing is to be performed at the same time are adjacent to each other.

Also, as in the first embodiment, the WR S/A block 40 is preferably provided on the same side of the memory cell array 10 as the drain selecting circuit 20, and the source latch circuit 50 is preferably provided on the same side of the memory cell array 10 as the source selecting circuit 30. With this arrangement, the information indicating whether data is to be written in the subject memory cell can be readily transferred from the WR S/A block 40 to the drain selecting circuit 20 and from the source latch circuit 50 to the source selecting circuit 30.

In the first embodiment, there are the bit lines BL0 through BL7 that connect sources and drains to the drain selecting circuit 20 and the source selecting circuit 30. The control circuit 68 preferably transfers the information (the first selecting information) stored in the WR S/A block 40 in step S24 of FIG. 7 as second selecting information to the source latch circuit 50 via the bit lines. By doing so, the chip area can be reduced, without the necessity to prepare a new line for transferring data from the WR S/A block 40 to the source latch circuit 50.

Further, in the first embodiment, the control circuit 68 preferably causes the drain selecting circuit 20 and the source selecting circuit 30 to connect the WR S/A block 40 and the source latch circuit 50 to the main bit lines, so as to transfer information from the WR S/A block 40 to the source latch circuit 50, as in steps S22 through S24 of FIG. 7.

In FIG. 11, the memory cell connected between the BL addresses "1" and "2" is set as a first memory cell, the memory cell connected between the BL addresses "2" and "3" is a second memory cell, and the bit lines at the BL addresses "1", "2", and "3" are a first bit line, a second bit line, and a third bit line, respectively. In the cell blocks W1 and W3 in FIG. 11, when data is written in the first memory cell, the control circuit 68 causes the drain selecting circuit 20 to select the second bit line connected to the first memory cell, and causes the source selecting circuit 30 to select the first bit line that is the other bit line connected to the first memory cell, as in the case with the signal S3PGM. Data is then written in the first memory cell in accordance with the first selecting information. The control circuit 68 next causes the source selecting circuit 30 to select the second bit line, and controls the drain selecting circuit 20 to maintain the second bit line, as in the case with the signal PGMSU. The control circuit 68 then transfers the first selecting information from the WR S/A block 40 to the source latch circuit 50. When data is written in the second memory cell, the control circuit 68 causes the drain selecting circuit 20 to select the third bit line that is the other bit lint connected to the second memory cell to which the second bit line is connected, and controls the source selecting circuit 30 to maintain the second bit line, as in the case with the signal P0PGM. In accordance with the first selecting information, data is written in the second memory cell.

Further, in the cell blocks W0 and W2 shown in FIG. 11, when data is written in the first memory cell, the control circuit 68 causes the drain selecting circuit 20 to select the first bit line connected to the first memory cell, and causes the source selecting circuit 30 to select the second bit line that is the other bit line connected to the first memory cell, as in the case with the signal S3PGM. In accordance with the first selecting information, data is written in the first memory cell. The control circuit 68 next controls the source selecting circuit 30 to maintain the second bit line, and causes the drain selecting circuit 20 to select the second bit line, as in the case with the signal PGMSU. The control circuit 68 then transfers the first selecting information from the WR S/A block 40 to the source latch circuit 50. When data is written in the second memory cell, the control circuit 68 controls the drain selecting circuit 20 to maintain the second bit line, and controls the source selecting circuit 30 to select the third bit line that is the other bit line connected to the second memory cell to which the second bit line is connected, as in the case with the signal P0PGM. In accordance with the first selecting information, data is written in the second memory cell.

In this manner, at the time of the signal PGMSU between divided data writing operations, information (the first selecting information) is transferred to the source latch circuit 50 through the main bit lines. Accordingly, the drain selecting circuit 20 and the source selecting circuit 30 do not need to select a new bit line for transmitting information. Since the signal PGMSU is ON while the next set of divided data is read into the WR S/A block 40 from the SRAM array 62, the time specially for the signal PGMSU is not required.

Further, in the first embodiment, the high-voltage generating circuit 66 (the first power supply) connected to the data line DATAB and the ground line ARVSS (the second power supply) are the power supplies that apply a voltage to memory cells so as to write data in the memory cells. At the time of data reading or erasing, the structure and the control method of the first embodiment can also be implemented. However, since a high voltage is applied between the source and drain of each memory cell when data is written in the memory cell, the difference in voltage between the source and the drain tends to become large, depending on the location of the memory cell, as shown in FIG. 3A. Also, leakage current is easily generated between bit lines, as shown in FIG. 12. To counter those problems, the present invention is applied when data is written in memory cells, as in the first embodiment. In this manner, greater effects can be achieved.

Second Embodiment

Figure 13:
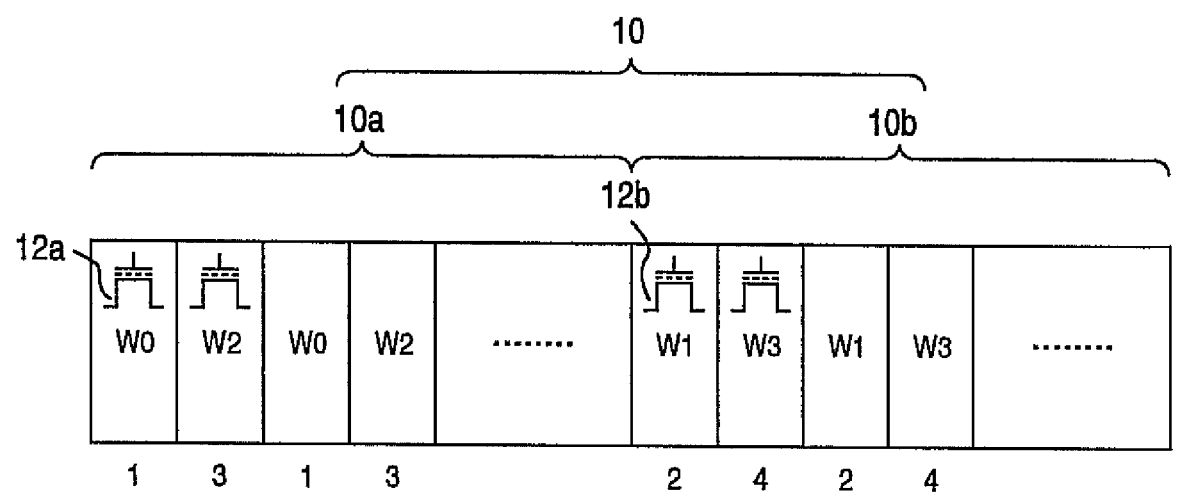
FIG. 13 shows the structure of the memory cell array of a flash memory in accordance with a second embodiment.

A second embodiment is an example case where the arrangement of the cell blocks W0 through W3 is changed from that of the first embodiment. FIG. 13 illustrates the memory cell array 10 of a flash memory in accordance with the second embodiment. The memory cell array 10 includes a left sub array 10a and a right sub array 10b (the first region and the second region) that are physically separated from each other and have different bit lines from each other. The sub arrays 10a and 10b include memory cells 12a and 12b (the first memory cells and the second memory cells), respectively. The cell blocks W0 and W2 are alternately arranged in the left sub array 10a, and the cell blocks W1 and W3 are alternately arranged in the right sub array 10b. The other aspects of the structure are the same as the structure of the first embodiment. When data is written in the memory cell array 10, the control circuit 68 first writes data at once in the memory cells in the 128 cell blocks W0 connected to the same word line WL in the sub array 10a, as indicated by the numbers allotted below the memory cell array 10 in FIG. 13. The control circuit 68 then performs writing in the cell blocks W1 in the sub array 10b, in the cell blocks W2 in the sub array 10a, and in the cell blocks W3 in the sub array 10b, in this order. In this manner, the control circuit 68 writes data alternately in the memory cells 12a in the sub array 10a and the memory cells 12b in the sub array 10b.

In the first embodiment, at the time of the signal S0SGM in FIG. 10, leakage current might flow between the bit line BL3 of the source of each cell block W0 and the precharged bit line BL0 of each corresponding cell block W2 (in the direction indicated by the arrow pointing at the left in FIG. 10), because, when data is written in the memory cells of the cell block W0, the control circuit 68 precharges the bit lines BL0 and BL1 of the memory cells of the cell block W2 in which data is to be written next. To counter this problem in the second embodiment, data is written alternately in the left sub array 10a and the right sub array 10b that are physically separated from each other and have different bit lines from each other. With this arrangement, the voltage is not applied to the bit lines in the vicinity area, and leakage current between bit lines can be restrained.

In the second embodiment, the memory cell array 10 has the two sub arrays 10a and 10b. However, the memory cell array 10 may have more than two sub arrays. In such a case, data is written sequentially in the memory cells in the more than two sub arrays. In this manner, the same effects as above can be achieved.

Third Embodiment

Figure 14:
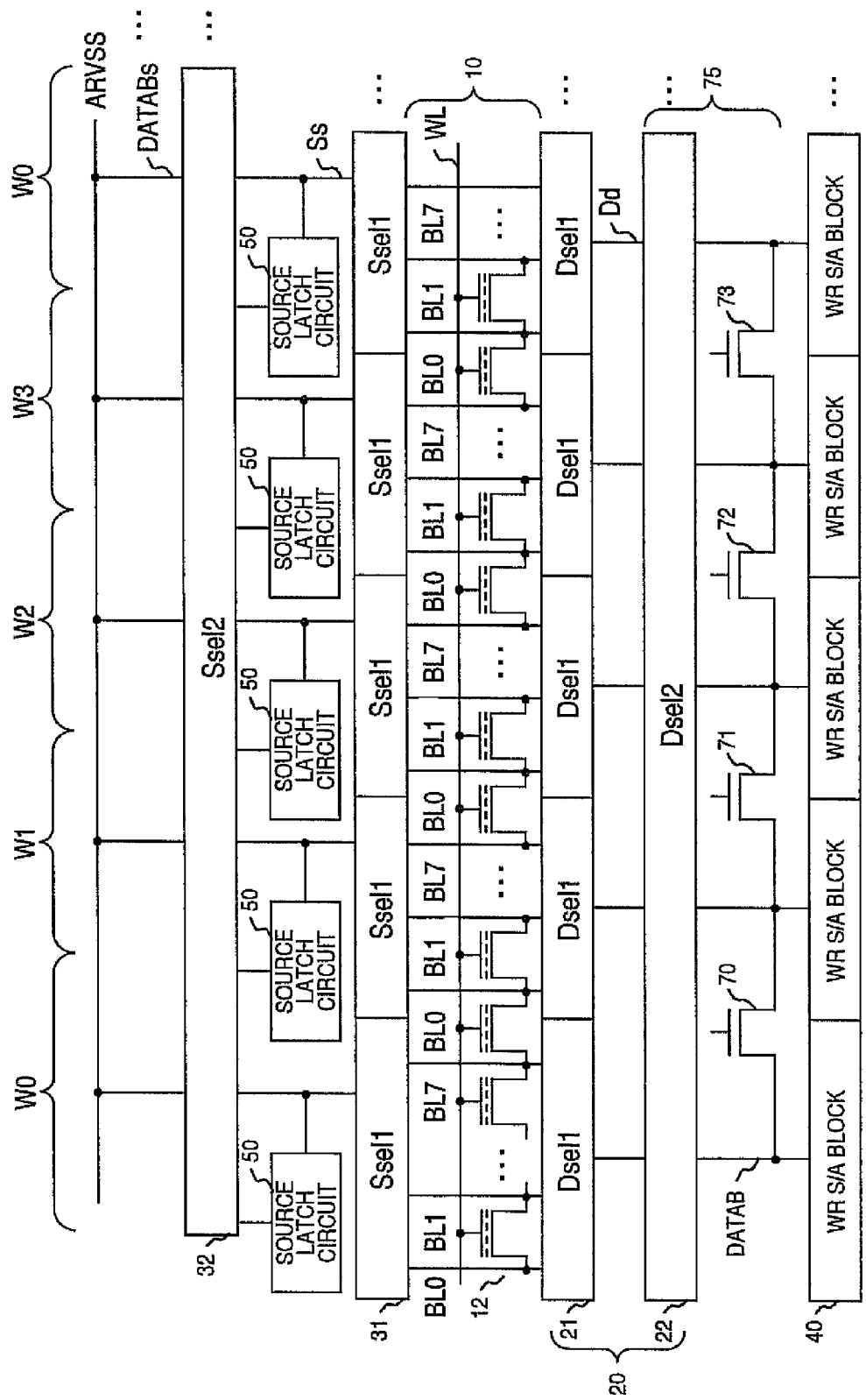
FIG. 14 illustrates the structures of the memory cells of one page in accordance with a third embodiment.

A third embodiment is an example case where a connecting circuit is provided to connect the bit lines connected to neighboring memory cells in the same divided region. FIG. 14 illustrates the vicinities of the memory cell array 10 in accordance with the third embodiment. Unlike the structure illustrated in FIG. 4, this structure includes FETs 70 through 73 (the selecting transistors) between the connecting lines DATAB. The FETs 70 through 73 and Dsel1 (21) constitute a connecting circuit 75. Ssel1 (31) (the selecting circuit) selects one main bit line from the main bit lines connected to the memory cells in each cell block via bit lines. The selected main bit line is set as a connecting line Ss. The FETs 70 through 73 then connect the bit lines connected to the memory cells at the same address in the selected cell block selected by Dsel1 (21), or the bit lines connected to the neighboring memory cells in the divided region via the connecting line DATAB. The other aspects of the structure are the same as those in the structure of the first embodiment shown in FIG. 4. In FIGS. 14 and 4, like components are denoted by like reference numerals, and explanation of them is omitted herein.

FIG. 15 illustrates the operation of the third embodiment in the same manner as FIG. 9. At the time of the signal S0PGM, the bit lines BL0 and BL1 (the first bit lines) connected to the memory cells (the first memory cells) of the cell block W2 in which data is to be written next are precharged before data is written in those memory cells (the first memory cells). When the bit lines BL0 and BL1 (the first bit lines) are precharged, the connecting circuit 75 connects the memory cells of the cell block W2 to the bit lines BL2 and BL3 (the second bit lines) to which the memory cells (the second memory cells) of the neighboring cell blocks W1 and W3 (the neighboring cell blocks) in the divided region are connected. By doing so, the bit lines BL2 and BL3 of the cell blocks W1 and W3 are also precharged. Accordingly, when data is written in the memory cells of the cell block W2, the bit lines BL0 and BL1 of the cell block W2 can be boosted quickly, since the bit lines BL2 and BL3 of the neighboring cell blocks W1 and W3 have already been precharged.

The FETs 70 through 73 in FIG. 14 also connect the connecting line DATAB (the first connecting line) connected to the first bit lines to the connecting line DATAB (the second connecting line) connected to the second bit lines. Further, when writing is performed in the memory cells of the cell block W2, the connecting circuit 75 does not connect the bit lines BL0 and BL1 of the cell block W2 to the bit lines BL2 and BL3 of the cell blocks W1 and W3. In this manner, when writing is performed in the memory cells of the cell block W2, leakage current between the bit lines can be restrained.

Fourth Embodiment

A fourth embodiment is an example case where the arrangement of the cell blocks W0 through W3 is changed as in the second embodiment, and a connecting circuit is provided to connect the bit lines that connect the neighboring memory cells in the same divided region as in the third embodiment. FIG. 16 illustrates the memory cell array 10 of a flash memory in accordance with the fourth embodiment. In the left sub array 10a, the cell blocks W2 and W0 are alternately arranged every other cell block, in such order as "W2, W2, W0, W0 ... ". In the right sub array 10b, the cell blocks W3 and W1 are alternately arranged in such order as "W3, W3, W1, W1 ... ". Also, FETs 70 through 73 (the selecting transistors) are provided between the connecting lines DATAB, as in the third embodiment. The other aspects of the structure are the same as those of the first embodiment.

Figure 17:
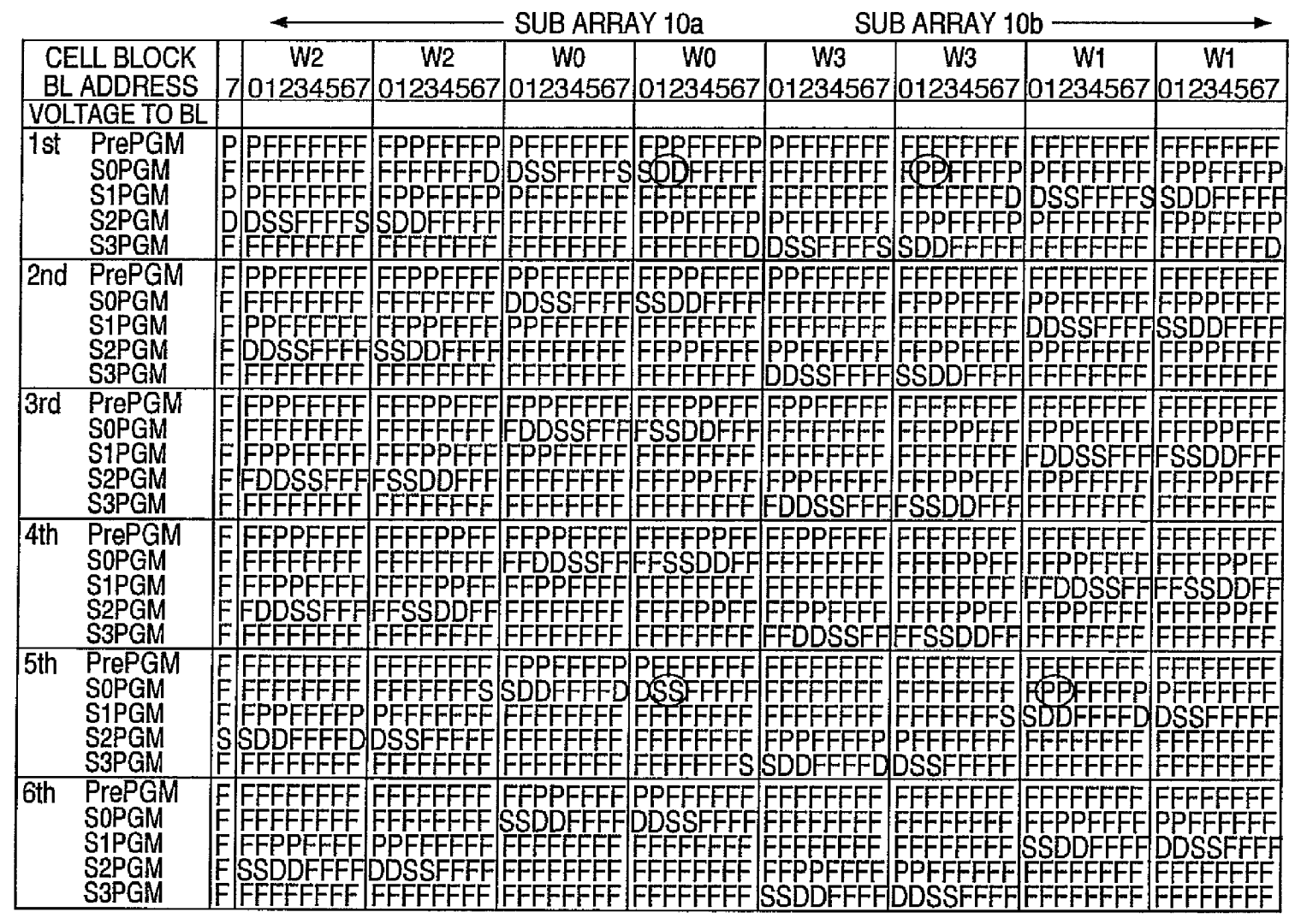

FIG. 17 illustrates the operation of the fourth embodiment, showing the region between the sub array 10a and the sub array 10b of the memory cell array 10. The voltages to be applied to the bit lines BL are denoted by the same alphabetical codes as those in FIG. 9, and explanation of them is omitted herein. Writing is performed in the order of "1st" through "6th", with the addresses in each cell block are changed. The operation with the voltages PrePGM through S3PGM is performed to write data in the divided region. The writing operation shown in FIG. 17 involves six sets of divided data.

In accordance with the fourth embodiment, when data is written in the memory cells of a cell block, the bit lines can be boosted quickly, since the bit lines of the neighboring cell blocks have also been precharged, as in the third embodiment. Also, data is written alternately in the left sub array 10a and the right sub array 10b, as in the second embodiment. Further, the cell blocks W0 and W2 are alternately arranged every other cell block in the sub array 10a, and the cell blocks W1 and W3 are alternately arranged every other cell block in the sub array 10b. Accordingly, the distances between the bit lines to which voltage is to be applied can be made wider also on the boundary between the sub array 10a and the sub array 10b that is close to the bit lines to which voltage is most often applied. For example, in the example case shown in FIG. 17, the narrowest distance between a "D" and a "P" is seen in the "1st", and 15 bit lines exist between the circles shown on the row of S0PGM. Meanwhile, the narrowest distance between an "S" and a "D" is seen in the "5th", and 23 bit lines exist between the circles shown on the row of S0PGM. In this manner, leakage current between bit lines can be restrained. Furthermore, in two cell blocks adjacent to each other, for example, in two cell blocks W0 adjacent to each other, the addresses of the bit lines are reversed as "DDSS" and "SSDD", for example. In this manner, an "S" does not come close to a "D". Thus, leakage current between the bit lines can be restrained.

Although the first through fourth embodiments involve virtual ground flash memories having NAND interfaces, the present invention is not limited to them. However, a virtual ground flash memory has bit lines formed with a diffusion layer, and therefore, leakage current easily flow between the bit lines. To counter this problem, the present invention is applied to a virtual ground flash memory, so as to achieve great effects. Further, in a virtual ground flash memory having a NAND interface, memory cells in which writing is to be performed at the same time are adjacent to each other. As a result, leakage current is easily generated between the bit lines. Therefore, the present invention is applied to a virtual ground flash memory having a NAND interface, so as to achieve greater effects.

Although the preferred embodiments of the present invention have been described so far, the present invention is not limited to those specific embodiments, and various changes and modifications may be made to them within the scope of the present invention.

Embodiments generally relate to semiconductor devices. More particularly, embodiments allow lower-cost semiconductor devices. In one implementation, the various embodiments are applicable to flash memory and devices that utilize flash memory. Flash memory is a form of non-volatile memory that can be electrically erased and reprogrammed. As such, flash memory, in general, is a type of electrically erasable programmable read only memory (EEPROM).

Like Electrically Erasable Programmable Read Only Memory (EEPROM), flash memory is nonvolatile and thus can maintain its contents even without power. However, flash memory is not standard EEPROM. Standard EEPROMs are differentiated from flash memory because they can be erased and reprogrammed on an individual byte or word basis while flash memory can be programmed on a byte or word basis, but is generally erased on a block basis. Although standard EEPROMs may appear to be more versatile, their functionality requires two transistors to hold one bit of data. In contrast, flash memory requires only one transistor to hold one bit of data, which results in a lower cost per bit. As flash memory costs far less than EEPROM, it has become the dominant technology wherever a significant amount of non-volatile, solid-state storage is needed.

Exemplary applications of flash memory include digital audio players, digital cameras, digital video recorders, and mobile phones. Flash memory is also used in USB flash drives, which are used for general storage and transfer of data between computers. Also, flash memory is gaining popularity in the gaming market, where low-cost fast-loading memory in the order of a few hundred megabytes is required, such as in game cartridges. Additionally, flash memory is applicable to cellular handsets, smartphones, personal digital assistants, set-top boxes, digital video recorders, networking and telecommunication equipments, printers, computer peripherals, automotive navigation devices, and gaming systems.

As flash memory is a type of non-volatile memory, it does not need power to maintain the information stored in the chip. In addition, flash memory offers fast read access times and better shock resistance than traditional hard disks. These characteristics explain the popularity of flash memory for applications such as storage on battery-powered devices (e.g., cellular phones, mobile phones, IP phones, wireless phones, etc.).

Flash memory stores information in an array of floating gate transistors, called "cells", each of which traditionally stores one bit of information. However, newer flash memory devices, such as MirrorBit® Flash Technology from Spansion Inc., can store more than 1 bit per cell. The MirrorBit cell doubles the intrinsic density of a Flash memory array by storing two physically distinct bits on opposite sides of a memory cell. Each bit serves as a binary bit of data (e.g., either 1 or 0) that is mapped directly to the memory array. Reading or programming one side of a memory cell occurs independently of whatever data is stored on the opposite side of the cell.

With regards to wireless markets, flash memory that utilizes MirrorBit® technology has several key advantages. For example, flash memory that utilizes MirrorBit® technology is capable of burst-mode access as fast as 80 MHz, page access times as fast as 25 ns, simultaneous read-write operation for combined code and data storage, and low standby power (e.g., 1 µA).

Figure 18:
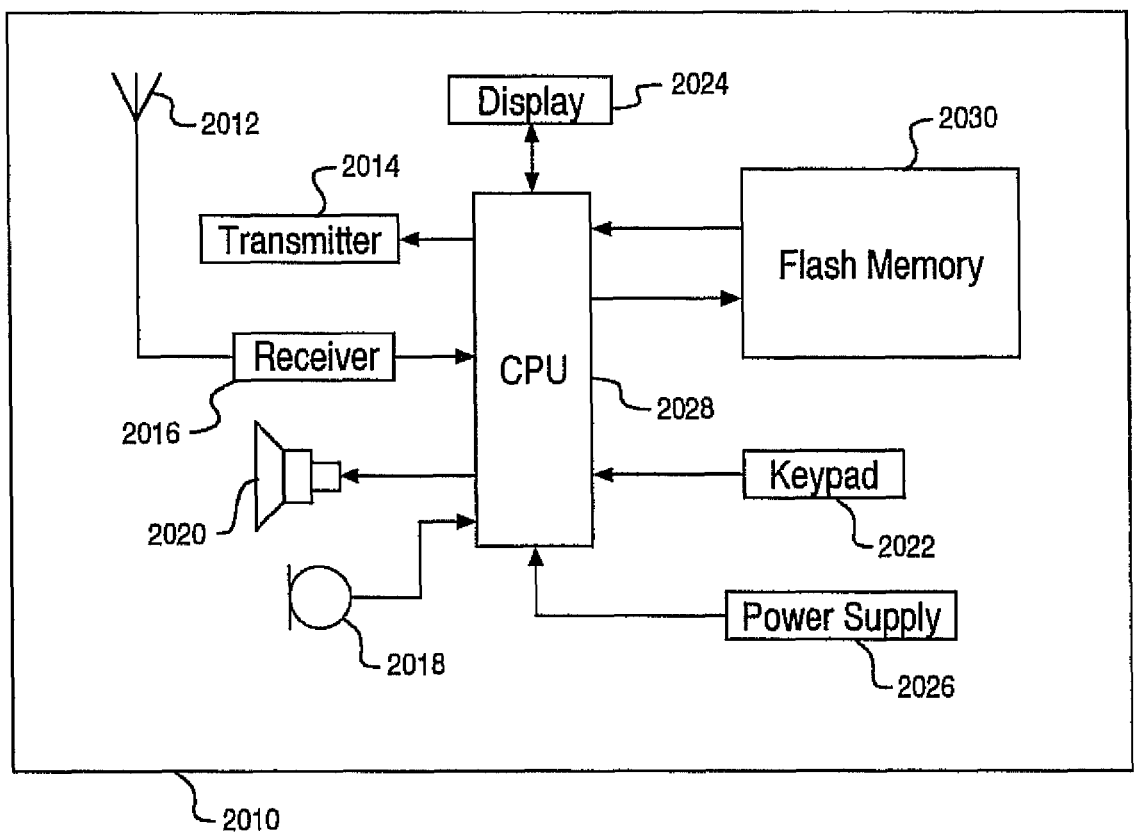
FIG. 18 illustrates a block diagram of a conventional portable phone, upon which embodiments may be implemented.

FIG. 18 shows a block diagram of a conventional portable telephone 2010 (e.g., cell phone, cellular phone, mobile phone, internet protocol phone, wireless phone, etc.), upon which embodiments can be implemented. The cell phone 2010 includes an antenna 2012 coupled to a transmitter 2014 and a receiver 2016, as well as a microphone 2018, a speaker 2020, a keypad 2022, and a display 2024. The cell phone 2010 also includes a power supply 2026 and a central processing unit (CPU) 2028, which may be an embedded controller, conventional microprocessor, or the like. In addition, the cell phone 2010 includes integrated, flash memory 2030. Flash memory 2030 includes a memory cell array that includes non-volatile memory cells; a first selecting circuit that connects or disconnects a source and a drain of a transistor that forms one of the memory cells, to or from a first power supply; and a second selecting circuit that connects or disconnects the source and drain to or from a second power supply, the first selecting circuit and the second selecting circuit being arranged on the opposite sides of the memory cell array. According to various embodiments, it is possible to provide a semiconductor device, such as flash memory, that can keep constant the voltage to be applied to the memory cells, restrain leakage current between the memory cells, and quickly precharge the bit lines connected between the memory cells, when data writing, data reading, or data erasing is performed in the memory cells in a flash memory having the non-volatile memory cells. The present invention also provides a method of controlling such a semiconductor device. As a result, the flash memory 2030 is more efficient and is able to be manufactured at a much lower cost than previous. This decreased cost and increased efficiency for the flash memory translates into lower costs and increased speed for various devices, such as mobile phones, cellular phones, internet protocol phones, and/or wireless phones.

Flash memory comes in two primary varieties, NOR-type flash and NAND-type flash. While the general memory storage transistor is the same for all flash memory, it is the interconnection of the memory cells that differentiates the designs. In a conventional NOR-type flash memory, the memory cell transistors are connected to the bit lines in a parallel configuration, while in a conventional NAND-type flash memory, the memory cell transistors are connected to the bit lines in series. For this reason, NOR-type flash is sometimes referred to as "parallel flash" and NAND-type flash is referred to as "serial flash."

Traditionally, portable phone (e.g., cell phone) CPUs have needed only a small amount of integrated NOR-type flash memory to operate. However, as portable phones (e.g., cell phone) have become more complex, offering more features and more services (e.g., voice service, text messaging, camera, ring tones, email, multimedia, mobile TV, MP3, location, productivity software, multiplayer games, calendar, and maps.), flash memory requirements have steadily increased. Thus, a less expensive flash memory will render a portable phone more competitive in the telecommunications market.

Also, as mentioned above, flash memory is applicable to a variety of devices other than portable phones. For instance, flash memory can be utilized in personal digital assistants, set-top boxes, digital video recorders, networking and telecommunication equipments, printers, computer peripherals, automotive navigation devices, and gaming systems.

Figure 19:
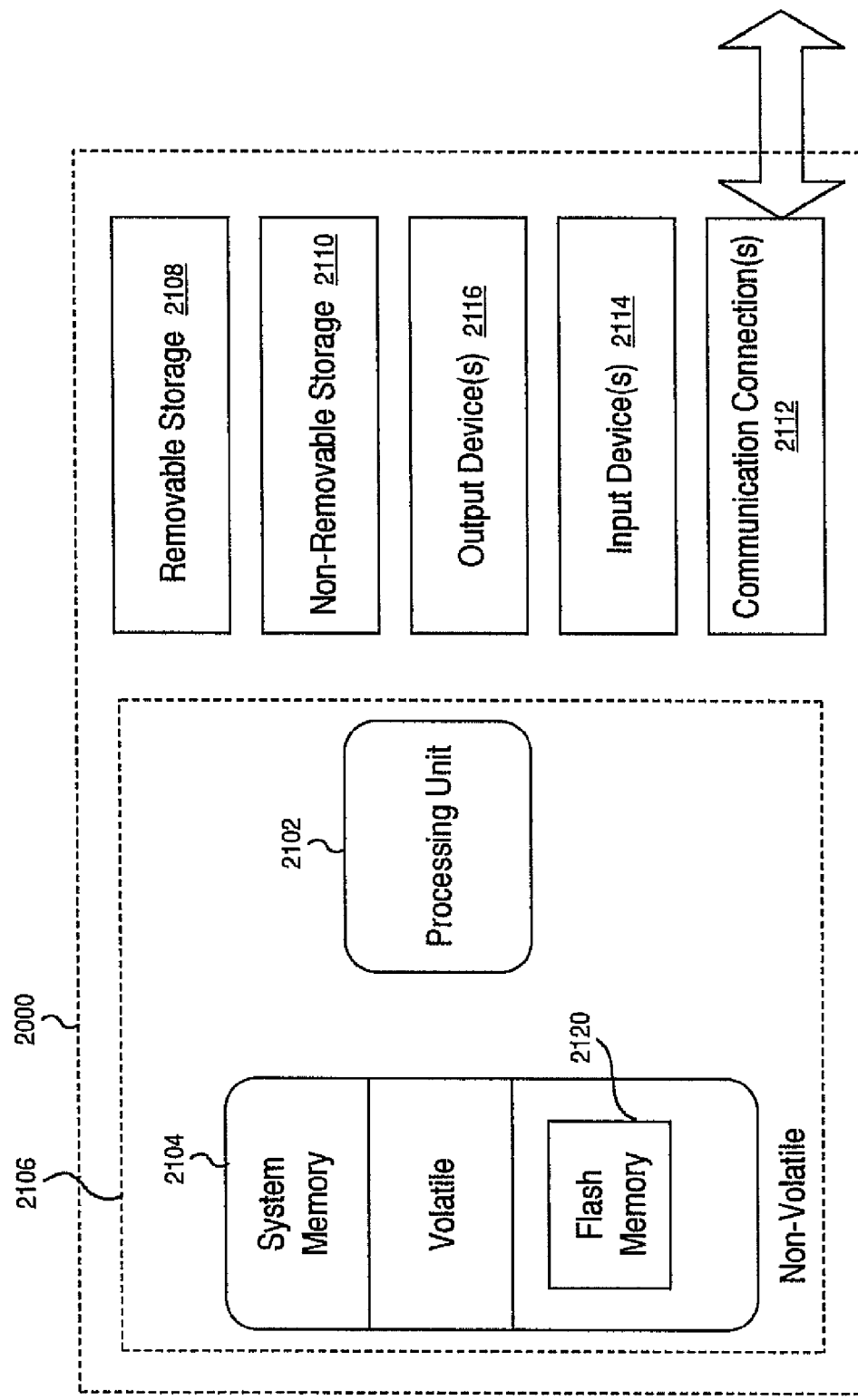
FIG. 19 illustrates a block diagram of a computing device, upon which embodiments may be implemented.

FIG. 19 illustrates a block diagram of a computing device 2100, upon which embodiments of the present claimed subject matter can be implemented. Although computing device 2100 is shown and described in FIG. 19 as having certain numbers and types of elements, the embodiments are not necessarily limited to the exemplary implementation. That is, computing device 2100 can include elements other than those shown, and can include more than one of the elements that are shown. For example, computing device 2100 can include a greater number of processing units than the one (processing unit 2102) shown. Similarly, in another example, computing device 2100 can include additional components not shown in FIG. 19.

Also, it is appreciated that the computing device 2100 can be a variety of things. For example, computing device 2100 may be, but is not limited to, a personal desktop computer, a portable notebook computer, a personal digital assistant (PDA), and a gaming system. Flash memory is especially useful with small-form-factor computing devices such as PDAs and portable gaming devices. Flash memory offers several advantages. In one example, flash memory is able to offer fast read access times while at the same time being able to withstand shocks and bumps better than standard hard disks. This is important as small computing devices are often moved around and encounter frequent physical impacts. Also, flash memory is more able than other types of memory to withstand intense physical pressure and/or heat. Thus, portable computing devices are able to be used in a greater range of environmental variables.

In its most basic configuration, computing device 2100 typically includes at least one processing unit 2102 and memory 2104. Depending on the exact configuration and type of computing device, memory 2104 may be volatile (such as RAM), non-volatile (such as ROM, flash memory, etc.) or some combination of the two. This most basic configuration of computing device 2100 is illustrated in FIG. 11 by line 2106. Additionally, device 2100 may also have additional features/functionality. For example, device 2100 may also include additional storage (removable and/or non-removable) including, but not limited to, magnetic or optical disks or tape. In one example, in the context of a gaming system, the removable storage could a game cartridge receiving component utilized to receive different game cartridges. In another example, in the context of a Digital Versatile Disc (DVD) recorder, the removable storage is a DVD receiving component utilized to receive and read DVDs. Such additional storage is illustrated in FIG. 19 by removable storage 2108 and non-removable storage 2110. Computer storage media includes volatile and nonvolatile, removable and non-removable media implemented in any method or technology for storage of information such as computer readable instructions, data structures, program modules or other data. Memory 2104, removable storage 2108 and non-removable storage 2110 are all examples of computer storage media. Computer storage media includes, but is not limited to, RAM, ROM, EEPROM, flash memory 2120 or other memory technology, CD-ROM, digital video disks (DVD) or other optical storage, magnetic cassettes, magnetic tape, magnetic disk storage or other magnetic storage devices, or any other medium which can be used to store the desired information and which can accessed by device 2100. Any such computer storage media may be part of device 2100.

In the present embodiment, the flash memory 2120 comprises: a memory cell array that includes non-volatile memory cells; a first selecting circuit that connects or disconnects a source and a drain of a transistor that forms one of the memory cells, to or from a first power supply; and a second selecting circuit that connects or disconnects the source and drain to or from a second power supply, the first selecting circuit and the second selecting circuit being arranged on the opposite sides of the memory cell array. According to various embodiments, it is possible to provide a semiconductor device, such as flash memory, that can keep constant the voltage to be applied to the memory cells, restrain leakage current between the memory cells, and quickly precharge the bit lines connected between the memory cells, when data writing, data reading, or data erasing is performed in the memory cells in a flash memory having the non-volatile memory cells. The present invention also provides a method of controlling such a semiconductor device. As a result, the flash memory 2030 is more efficient and is able to be manufactured at a much lower cost than previous. This decreased cost and increased efficiency for the flash memory translates into lower costs and increased speed for various devices, such as personal digital assistants, set-top boxes, digital video recorders, networking and telecommunication equipments, printers, computer peripherals, automotive navigation devices, gaming systems, mobile phones, cellular phones, internet protocol phones, and/or wireless phones. Further, in one embodiment, the flash memory 2120 utilizes MirrorBit® technology to allow storing of two physically distinct bits on opposite sides of a memory cell.

Device 2100 may also contain communications connection(s) 2112 that allow the device to communicate with other devices. Communications connection(s) 2112 is an example of communication media. Communication media typically embodies computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. The term computer readable media as used herein includes both storage media and communication media.

Device 2100 may also have input device(s) 2114 such as keyboard, mouse, pen, voice input device, game input device (e.g., a joy stick, a game control pad, and/or other types of game input device), touch input device, etc. Output device(s) 2116 such as a display (e.g., a computer monitor and/or a projection system), speakers, printer, network peripherals, etc., may also be included. All these devices are well known in the art and need not be discussed at length here.

Aside from mobile phones and portable computing devices, flash memory is also widely used in portable multimedia devices, such as portable music players. As users would desire a portable multimedia device to have as large a storage capacity as possible, an increase in memory density would be advantageous. Users would also benefit from reduced memory read time and reduced cost.

Figure 20:
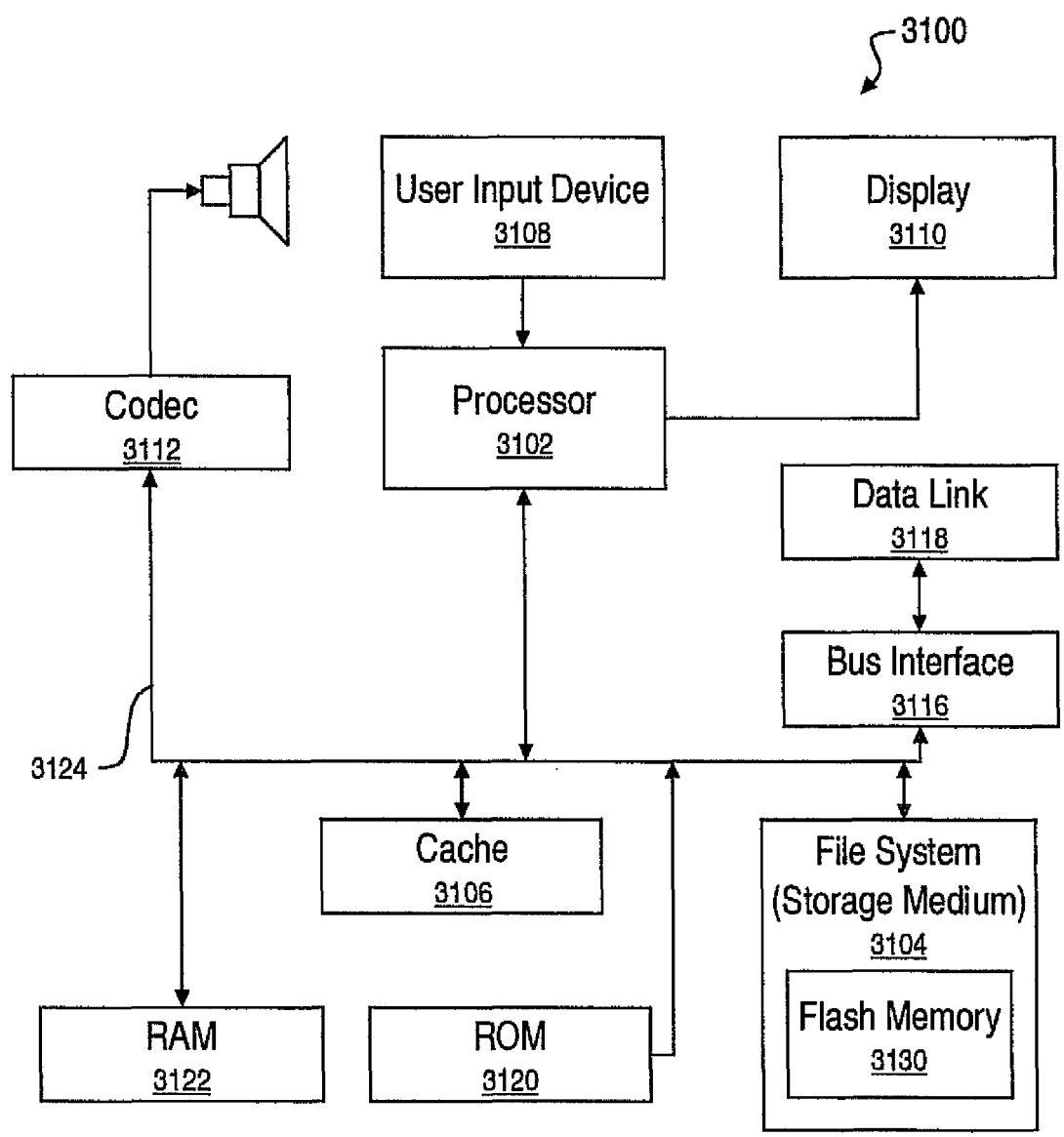
FIG. 20 illustrates an exemplary portable multimedia device, or media player, in accordance with various embodiments of the present invention.

FIG. 20 shows an exemplary portable multimedia device, or media player, 3100 in accordance with an embodiment of the invention. The media player 3100 includes a processor 3102 that pertains to a microprocessor or controller for controlling the overall operation of the media player 3100. The media player 3100 stores media data pertaining to media assets in a file system 3104 and a cache 3106. The file system 3104 is, typically, a storage medium or a plurality of storage media, such as disks, memory cells, and the like. The file system 3104 typically provides high capacity storage capability for the media player 3100. Also, file system 3104 includes flash memory 3130. In the present embodiment, the flash memory 3130 comprises: a memory cell array that includes non-volatile memory cells; a first selecting circuit that connects or disconnects a source and a drain of a transistor that forms one of the memory cells, to or from a first power supply; and a second selecting circuit that connects or disconnects the source and drain to or from a second power supply, the first selecting circuit and the second selecting circuit being arranged on the opposite sides of the memory cell array. According to various embodiments, it is possible to provide a semiconductor device, such as flash memory, that can keep constant the voltage to be applied to the memory cells, restrain leakage current between the memory cells, and quickly precharge the bit lines connected between the memory cells, when data writing, data reading, or data erasing is performed in the memory cells in a flash memory having the non-volatile memory cells. The present invention also provides a method of controlling such a semiconductor device. As a result, the flash memory 2030 is more efficient and is able to be manufactured at a much lower cost than previous. This decreased cost and increased efficiency for the flash memory translates into lower costs and increased speed for various devices, such as personal digital assistants, set-top boxes, digital video recorders, networking and telecommunication equipments, printers, computer peripherals, automotive navigation devices, gaming systems, mobile phones, cellular phones, internet protocol phones, and/or wireless phones. However, since the access time to the file system 3104 is relatively slow, the media player 3100 can also include a cache 3106. The cache 3106 is, for example, Random-Access Memory (RAM) provided by semiconductor memory. The relative access time to the cache 3106 is substantially shorter than for the file system 3104. However, the cache 3106 does not have the large storage capacity of the file system 3104. Further, the file system 3104, when active, consumes more power than does the cache 3106. The power consumption is particularly important when the media player 3100 is a portable media player that is powered by a battery (not shown). The media player 3100 also includes a RAM 3122 and a Read-Only Memory (ROM) 3120. The ROM 3120 can store programs, utilities or processes to be executed in a non-volatile manner. The RAM 3122 provides volatile data storage, such as for the cache 3106.

The media player 3100 also includes a user input device 3108 that allows a user of the media player 3100 to interact with the media player 3100. For example, the user input device 3108 can take a variety of forms, such as a button, keypad, dial, etc. Still further, the media player 3100 includes a display 3110 (screen display) that can be controlled by the processor 3102 to display information to the user. A data bus 3124 can facilitate data transfer between at least the file system 3104, the cache 3106, the processor 3102, and the CODEC 3112. The media player 3100 also includes a bus interface 3116 that couples to a data link 3118. The data link 3118 allows the media player 3100 to couple to a host computer.

In one embodiment, the media player 3100 serves to store a plurality of media assets (e.g., songs, photos, video, etc.) in the file system 3104. When a user desires to have the media player play/display a particular media item, a list of available media assets is displayed on the display 3110. Then, using the user input device 3108, a user can select one of the available media assets. The processor 3102, upon receiving a selection of a particular media item, supplies the media data (e.g., audio file, graphic file, video file, etc.) for the particular media item to a coder/decoder (CODEC) 3110. The CODEC 3110 then produces analog output signals for a speaker 3114 or a display 3110. The speaker 3114 can be a speaker internal to the media player 3100 or external to the media player 3100. For example, headphones or earphones that connect to the media player 3100 would be considered an external speaker.

In a particular embodiment, the available media assets are arranged in a hierarchical manner based upon a selected number and type of groupings appropriate to the available media assets. For example, in the case where the media player 3100 is an MP3-type media player, the available media assets take the form of MP3 files (each of which corresponds to a digitally encoded song or other audio rendition) stored at least in part in the file system 3104. The available media assets (or in this case, songs) can be grouped in any manner deemed appropriate. In one arrangement, the songs can be arranged hierarchically as a list of music genres at a first level, a list of artists associated with each genre at a second level, a list of albums for each artist listed in the second level at a third level, while at a fourth level a list of songs for each album listed in the third level, and so on.

Finally, various aspects of the present invention are summarized in the following.

According to a first aspect of the present invention, there is provided a semiconductor device including: a memory cell array that includes non-volatile memory cells; a first selecting circuit that connects or disconnects a source and a drain of a transistor that forms one of the memory cells, to or from a first power supply; and a second selecting circuit that connects or disconnects the source and drain to or from a second power supply, the first selecting circuit and the second selecting circuit being arranged on the opposite sides of the memory cell array.

The semiconductor device may further include: a first storage unit that stores first selecting information that indicates whether the source and drain are to be connected to the first power supply, the first storage unit being connected to the first selecting circuit; and a second storage unit that stores second selecting information that indicates whether the source and drain are to be connected to the second power supply, the second storage unit being connected to the second selecting circuit. With this structure, the first selecting circuit and the second selecting circuit can connect the memory cells to the first power supply and the second power supply, based on the first selecting information stored in the first storage unit and the second selecting information stored in the second storage unit.

In the above-described semiconductor device, the first selecting information is information that indicates whether writing may be to be performed in the corresponding one of the memory cells. In the above-described semiconductor device, the second selecting information may be the same information as the first selecting information; and when the first selecting information indicates that writing is not to be performed in the corresponding memory cell, the second selecting circuit has the source and drain unconnected to the second power supply.

In the above-described semiconductor device, the first storage unit and the second storage unit may be provided on the same sides of the memory cell array as the first selecting circuit and the second selecting circuit, respectively. With this structure, the first selecting information and the second selecting information can be easily transferred from the first storage unit and the second storage unit to the first selecting circuit and the second selecting circuit, respectively.

The semiconductor device may further include: bit lines that connect the source and drain, the first selecting circuit, and the second selecting circuit; and a control circuit that transfers the first selecting information stored in the first storage unit to the second storage unit via the bit lines, the transferred first selecting information being the second selecting information. With this structure, there is no need to prepare a special line for transferring information from the first storage unit to the second storage unit, and the circuit area can be reduced.

In the above-described semiconductor device, the control circuit may connect the first storage unit, the second storage unit, and the bit lines to the first selecting circuit and the second selecting circuit, and transfers the first selecting information from the first storage unit to the second storage unit. With this structure, the first storage unit and the second storage unit are connected to each other via the bit lines, so that the first selecting information can be easily transferred from the first storage unit to the second storage unit.

In the above-described semiconductor device, when data is written in a first memory cell that is one of the memory cells in accordance with the first selecting information, the control circuit may cause the first selecting circuit to select a second bit line that is a bit line connected to the first memory cell, and causes the second selecting circuit to select a first bit line that is another bit line connected to the first memory cell; the control circuit next causes the second selecting circuit to select the second bit line while controlling the first selecting circuit to maintain the second bit line, and transfers the first selecting information from the first storage unit to the second storage unit; and when data is written in a second memory cell that is another memory cell connected to the second bit line in accordance with the first selecting information, the control circuit may cause the first selecting circuit to select a third bit lint that is another bit line connected to the second memory cell while controlling the second selecting circuit to maintain the second bit line. With this structure, there is no need to select a bit line for transferring the first selecting information, and the time required for selecting bit lines can be shortened.

In the above-described semiconductor device, when data is written in a first memory cell that is one of the memory cells in accordance with the first selecting information, the control circuit may cause the first selecting circuit to select a first bit line that is a bit line connected to the first memory cell, and causes the second selecting circuit to select a second bit line that is another bit line connected to the first memory cell; the control circuit next may cause the first selecting circuit to select the second bit line while controlling the second selecting circuit to maintain the second bit line, and transfers the first selecting information from the first storage unit to the second storage unit; and when data is written in a second memory cell that is another memory cell connected to the second bit line in accordance with the first selecting information, the control circuit may cause the second selecting circuit to select a third bit lint that is another bit line connected to the second memory cell while controlling the first selecting circuit to maintain the second bit line. With this structure, there is no need to select a bit line for transferring the first selecting information, and the time required for selecting bit lines can be shortened.

In the above-described semiconductor device, the first power supply and the second power supply each may apply voltage for writing data to the memory cells. In this structure, the present invention is applied when data is written by applying a high voltage to the memory cells. In this manner, the present invention can exhibit greater effects.

According to a second aspect of the present invention, there is provided a method of controlling a semiconductor device that includes: a memory cell array that includes non-volatile memory cells; a first power supply and a second power supply that apply voltage to bit lines connected to sources and drains of transistors that form the memory cells; a first storage unit that stores first selecting information that indicates whether the bit lines are to be connected to the first power supply; and a second storage unit that stores second selecting information that indicates whether the bit lines are to be connected to the second power supply, the method including the steps of: connecting the first storage unit and the second storage unit to the bit lines; and transferring the first selecting information from the first storage unit to the second storage unit via the bit lines.

According to a third aspect of the present invention, there is provided a semiconductor device including: a memory cell array that includes non-volatile memory cells; bit lines that are connected to sources and drains of transistors that form the memory cells; a first region and a second region that are contained in the memory cell array, are physically separated from each other, and have different ones of the bit lines from each other; and a control circuit that writes data alternately in the memory cells of the first region and in the memory cells of the second region.

In the above-described semiconductor device, the control circuit may precharge the bit line of one of the memory cells in which data is to be written next. With this structure, leakage current can be restrained between the precharged bit line and the bit lines connected to the memory cell to be programmed.

In the above-described semiconductor device, the control circuit may perform writing simultaneously in two or more of the memory cells contained in the first region or the second region. The semiconductor device may further include: word lines that are connected to gates of the transistors, the two or more of the memory cells in which writing is simultaneously performed are connected to the same one of the word lines.

According to a fourth aspect of the present invention, there is provided a method of controlling a semiconductor device that includes: a memory cell array that includes non-volatile memory cells; bit lines that are connected to sources and drains of transistors that form the memory cells; and a first region and a second region that are contained in the memory cell array, are physically separated from each other, and have different ones of the bit lines from each other, the method including the steps of: writing data in a first memory cell contained in the first region; writing data in a second memory cell contained in the second region; the step of writing data in the first memory cell and the step of writing data in the second memory cell are alternately repeated.

According to a fifth aspect of the present invention, there is provided a semiconductor device including: a memory cell array that includes non-volatile memory cells; bit lines that are connected to sources and drains of transistors that form the memory cells; word lines that are connected to gates of the transistors; a plurality of divided regions that are contained in the memory cell array, each of the divided regions having memory cells connected to the same one of the word lines, data being read simultaneously from the memory cells of the same one of the divided regions; a plurality of sub divided regions that are contained in each of the divided regions, each of the sub divided regions having memory cells connected to the same one of the word lines, data being written simultaneously in the memory cells of the same one of the sub divided regions; a plurality of cell blocks each having at least one bit contained in each of the divided regions, memory cells in each of the cell blocks being physically adjacent to one another; and a connecting circuit that connects bit lines connected to neighboring memory cells to each other in the divided region.

In the above-described semiconductor device, a first bit line that is a bit line connected to a first memory cell that is one of the memory cells in which data may be to be written is precharged before the data is written in the first memory cell; and when the first bit line is precharged, the connecting circuit may connect the first bit line to a second bit line that is a bit line connected to a second memory cell that is a memory cell neighboring the first memory cell in the divided region. With this structure, the first bit line connected to the memory cell in which data is to be written can be quickly boosted.

In the above-described semiconductor device, when the data is written in the first memory cell, the connecting circuit may disconnect the first bit line from the second bit line. In this structure, voltage is not applied to the second memory cell when data is written in the first memory cell. Thus, leakage current between the first bit line and the second bit line can be restrained.

In the above-described semiconductor device, the connecting circuit may include: a selecting transistor that is connected to a first connecting line connected to the first bit line, and to a second connecting line connected to the second bit line; and a selecting circuit that selects one of the bit lines connected to the memory cells of each one of the cell blocks, and connects the selected bit line to the first connecting line or the second connecting line.

According to a sixth aspect of the present invention, there is provided a method of controlling a semiconductor device that includes: a memory cell array that includes non-volatile memory cells; bit lines that are connected to sources and drains of transistors that form the memory cells; word lines that are connected to gates of the transistors; a plurality of divided regions that are contained in the memory cell array, each of the divided regions having memory cells connected to the same one of the word lines, data being read simultaneously from the memory cells of the same one of the divided regions; a plurality of sub divided regions that are contained in each of the divided regions, each of the sub divided regions having memory cells connected to the same one of the word lines, data being written simultaneously in the memory cells of the same one of the sub divided regions; and a plurality of cell blocks each having at least one bit contained in each of the divided regions, memory cells in each of the cell blocks being physically adjacent to one another, the method including the steps of: connecting a first bit line that is a bit line connected to a first memory cell that is a memory cell in which data is to be written, to a second bit line that is a bit line connected to a second memory cell that is a memory cell adjacent to the first memory cell in the divided region; precharging the first bit line and the second bit line; and writing the data in the first memory cell.

The above-described method may further include the step of: disconnecting the first bit line from the second bit line, the step of disconnecting is carried out before the step of writing the data. In this structure, voltage is not applied to the second memory cell when data is written in the first memory cell. Thus, leakage current between the first bit line and the second bit line can be restrained.

In the above-described semiconductor device, the non-volatile memory cells may be virtual ground memory cells. In this structure, the present invention is applied to virtual ground memory cells in which the bit lines are formed with a diffusion layer and leakage current easily flows between the bit lines. Thus, the present invention exhibits greater effects.

As described above, the present invention provides a semiconductor device that can keep constant the voltage to be applied to the memory cells, restrain leakage current between the memory cells, and quickly precharge the bit lines connected between the memory cells, when data writing, data reading, or data erasing is performed in the memory cells in a flash memory having the non-volatile memory cells. The present invention also provides a method of controlling such a semiconductor device.

Although a few preferred embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A semiconductor device comprising:
a memory cell array that includes non-volatile memory cells;
bit lines that are connected to sources and drains of transistors that form the memory cells;
word lines that are connected to gates of the transistors;
a plurality of divided regions that are contained in the memory cell array, each of the divided regions having memory cells connected to the same one of the word lines;
a plurality of sub divided regions that are contained in each of the divided regions, each of the sub divided regions having memory cells connected to the same one of the word lines;
a plurality of cell blocks each having at least one bit contained in each of the divided regions, memory cells in each of the cell blocks being physically adjacent to one another; and
a connecting circuit that connects bit lines connected to neighboring memory cells to each other in the divided region;
wherein a first bit line connected to a first memory cell that is one of the memory cells in which data is to be written is precharged before the data is written in the first memory cell;
when the first bit line is precharged, the connecting circuit connects the first bit line to a second bit line connected to a second memory cell that is a memory cell neighboring the first memory cell in the divided region; and
before the data is written in the first memory cell, the connecting circuit disconnects the first bit line from the second bit line.

2. The semiconductor device of claim 1, wherein, when the data is written in the first memory cell, the connecting circuit disconnects the first bit line from the second bit line.

3. The semiconductor device of claim 1, wherein the connecting circuit comprising:
a selecting transistor that is connected to a first connecting line connected to the first bit line, and to a second connecting line connected to the second bit line.

4. The semiconductor device of claim 1, wherein the plurality of divided regions that are contained in the memory cell array, each of the divided regions having memory cells connected to the same one of the word lines, data being read simultaneously from the memory cells of the same one of the divided regions.

5. The semiconductor device of claim 4, wherein the plurality of sub divided regions that are contained in each of the divided regions, each of the sub divided regions having memory cells connected to the same one of the word lines, data being written simultaneously in the memory cells of the same one of the sub divided regions.

6. The semiconductor device of claim 1, wherein the plurality of sub divided regions that are contained in each of the divided regions, each of the sub divided regions having memory cells connected to the same one of the word lines, data being written simultaneously in the memory cells of the same one of the sub divided regions.

7. The semiconductor device of claim 1, wherein the semiconductor device is flash memory.

8. The semiconductor device of claim 1, wherein the semiconductor device is NOR flash memory.

9. The semiconductor device of claim 1, wherein the semiconductor device is NAND flash memory.

10. A method of controlling a semiconductor device that includes: a memory cell array that includes non-volatile memory cells; bit lines that are connected to sources and drains of transistors that form the memory cells; word lines that are connected to gates of the transistors; a plurality of divided regions that are contained in the memory cell array, each of the divided regions having memory cells connected to the same one of the word lines; a plurality of sub divided regions that are contained in each of the divided regions, each of the sub divided regions having memory cells connected to the same one of the word lines; and a plurality of cell blocks each having at least one bit contained in each of the divided regions, memory cells in each of the cell blocks being physically adjacent to one another,
the method comprising:
connecting a first bit line connected to a first memory cell that is a memory cell in which data is to be written, to a second bit line connected to a second memory cell that is a memory cell adjacent to the first memory cell in the divided region;
precharging the first bit line and the second bit line;
disconnecting the first bit line from the second bit line; and
after the disconnecting, writing the data in the first memory cell.

11. The method of claim 10, wherein the plurality of divided regions that are contained in the memory cell array, each of the divided regions having memory cells connected to the same one of the word lines, data being read simultaneously from the memory cells of the same one of the divided regions.

12. The method of claim 11, wherein the plurality of sub divided regions that are contained in each of the divided regions, each of the sub divided regions having memory cells connected to the same one of the word lines, data being written simultaneously in the memory cells of the same one of the sub divided regions.

13. The method of claim 10, wherein the plurality of sub divided regions that are contained in each of the divided regions, each of the sub divided regions having memory cells connected to the same one of the word lines, data being written simultaneously in the memory cells of the same one of the sub divided regions.

14. The method of claim 10, wherein the non-volatile memory cells are virtual ground memory cells.

15. The method of claim 10, wherein the semiconductor device is flash memory.

16. The method of claim 10, wherein the semiconductor device is NOR flash memory.

17. The method of claim 10, wherein the semiconductor device is NAND flash memory.

* * * * *